(12) United States Patent
Ito et al.

(10) Patent No.: US 7,957,154 B2
(45) Date of Patent: Jun. 7, 2011

(54) MULTILAYER PRINTED CIRCUIT BOARD

(75) Inventors: Sotaro Ito, Gifu (JP); Michimasa Takahashi, Gifu (JP); Yukinobu Mikado, Gifu (JP)

(73) Assignee: Ibiden Co., Ltd., Ogaki-shi (JP)

( * ) Notice: Subject to any disclaimer, the term of this patent is extended or adjusted under 35 U.S.C. 154(b) by 840 days.

(21) Appl. No.: 11/611,538

(22) Filed: Dec. 15, 2006

(65) Prior Publication Data

US 2008/0007927 A1    Jan. 10, 2008

(30) Foreign Application Priority Data

Dec. 16, 2005  (JP) .................................. 2005-364088

(51) Int. Cl.
*H05K 1/16* (2006.01)

(52) U.S. Cl. ......... 361/765; 361/763; 361/766; 361/795

(58) Field of Classification Search .......... 361/763–766, 361/795; 257/679–692
See application file for complete search history.

(56) References Cited

U.S. PATENT DOCUMENTS

| | | | | |
|---|---|---|---|---|
| 7,023,073 | B2 * | 4/2006 | Mano | 257/659 |
| 7,348,662 | B2 * | 3/2008 | Miyazaki et al. | 257/679 |

FOREIGN PATENT DOCUMENTS

| | | |
|---|---|---|
| CN | 1543297 A | 11/2004 |
| JP | 2001-274034 | 10/2001 |
| JP | 2001-339165 | 12/2001 |
| JP | 2002-16327 | 1/2002 |
| JP | 2002-50874 | 2/2002 |
| JP | 2004-319605 | 11/2004 |

* cited by examiner

*Primary Examiner* — Tuan T Dinh
(74) *Attorney, Agent, or Firm* — Oblon, Spivak, McClelland, Maier & Neustadt, L.L.P.

(57) ABSTRACT

A multilayer printed circuit board, wherein, on a resin-insulating layer that houses a semiconductor element, another resin-insulating layer and a conductor circuit are formed with conductor circuits electrically connected through a via hole, wherein a electromagnetic shielding layer is formed on a resin-insulating layer surrounding a concave portion for housing a semiconductor element or on the inner wall surface of the concave portion, and the semiconductor element is embedded in the concave portion.

12 Claims, 9 Drawing Sheets

MULTILAYER PRINTED CIRCUIT BOARD

The present invention is based on Japan Patent Application No. 2005-364088, applied for on Dec. 16, 2005 as a priority claim, the details of which are incorporated herein.

TECHNICAL FIELD

The present invention relates to a multilayer printed circuit board, in which electronic components (semiconductor elements) such as IC are embedded and, more specifically, to a multilayer printed circuit board and the manufacturing method thereof in which the electronic connectivity or connection reliability is ensured between a pad of semiconductor elements and a conductor circuit of a multilayer printed circuit board.

BACKGROUND ART

Multilayer printed circuit boards embedding semiconductor elements exist and are disclosed in, for example, Japan Unexamined Patent Application Publication No. 2001-339165 or Japan Unexamined Patent Application Publication No. 2002-050874. The multilayer printed circuit boards which are disclosed in these documents are comprised by substrates on which a concave portion for embedding semiconductor elements is formed, semiconductor elements embedded in the concave portion of the substrate, an insulating layer formed on the substrate in order to coat the semiconductor elements, a conductor circuit formed on the surface of the insulating layer, and a via hole provided on the insulating layer to electrically connect the conductor circuit to a pad of the semiconductor elements.

Such typical multilayer printed circuit boards comprise an external connecting terminal (for example, PGA, BGA and the like) on the surface of the outermost layer, and semiconductor elements embedded in a substrate so as to be connected electrically to the outside through these external connecting terminals.

SUMMARY OF THE INVENTION

The present invention provides a multilayer printed circuit board, wherein, on a resin-insulating layer that houses a semiconductor element, another resin-insulating layer and conductor circuit have been formed with electrical connection through a via hole,
wherein said semiconductor element is embedded in a concave portion provided on said resin-insulating layer, and an electromagnetic shielding layer is formed on a resin-insulating layer surrounding the concave portion.

Preferably, said electromagnetic shielding layer surrounds the semiconductor elements and is formed by a side metal layer and a bottom metal layer.

Furthermore, said shield layer may be formed by either a side metal layer or a bottom metal layer.

According to the present invention, it is preferable that a bottom metal layer be formed on the bottom of said concave portion, and semiconductor elements be placed on the bottom metal layer.

According to the present invention, said electromagnetic shielding layer may be a side metal layer formed on a resin insulating layer located on the outside of the concave portion. Furthermore, as an optional constitution, said electromagnetic shielding layer may be formed by side metal layers of multiple columns (cylinder, elliptic cylinder, polygonal column and the like) formed on the resin insulating layer located on the outside of the concave portion, and each side metal layer is coupled to another.

Additionally, said electromagnetic shielding layer may be formed by a bottom metal layer formed on the resin insulating layer located on the lower side of the bottom of the concave portion.

Moreover, it is possible that said electromagnetic shielding layer is comprised of a side metal layer of multiple columns formed on the resin insulating layer located on the outside of the concave portion, and are also coupled to one another, and a bottom metal layer formed on a resin insulating layer located on the bottom of the concave portion or the lower side of the bottom, said side metal layer of columns and said bottom metal layer being coupled.

Furthermore, said bottom metal layer may be configured so as to function as an electromagnetic shielding layer by coupling side metal layers of said multiple columns.

Moreover, said bottom metal layer is coupled to a side metal layer by coating metal on the inner wall of said multiple non-through holes, or a side metal layer formed by filling metal into non-through holes.

Additionally, said electromagnetic shielding layer may be formed by a metal layer formed on the inner wall of said concave portion.

According to the present invention, said concave portion may be formed such that it has a side which is tapered so as to become broader from the bottom upward.

Furthermore, according to the present invention, it is possible that a columnar electrode or a mediation layer is formed on a pad of semiconductor elements housed and fixed in said concave portion, and said pad and a via hole are connected electrically through the columnar electrode or mediation layer.

Moreover, the present invention is a multilayer printed circuit board, wherein, on a resin-insulating layer that houses a semiconductor element, another resin-insulating layer and conductor circuit are formed with electrical connection through a via hole,
wherein
said semiconductor elements are embedded in a concave portion provided on a resin insulating layer, an electromagnetic shielding layer is formed on the resin insulating layer surrounding the concave portion, the electromagnetic shielding layer is formed by a side metal layer formed by a metal layer form in which metal coats the inner wall surface of multiple non-through holes, a metal layer form in which metal fills multiple non-through holes, or a form of multiple metal columns.

Preferably, said side metal layer is that in which conductive metal fills multiple non-through holes. Plating, paste and the like may be used as the conductive metal.

Said column is preferably at least one form selected from among a cylinder, an elliptic cylinder, and a polygonal column.

It is preferable that said electromagnetic shielding layer include a bottom metal layer formed on a resin insulating layer located on the lower side of the bottom of said concave portion.

Said side metal layer is of a form in which metal coats the inner wall surface of multiple non-through holes, a form in which metal fills multiple non-through holes, or a form of multiple metal columns, and at least one part of the side metal layer is coupled to another.

Said electromagnetic shielding layer is preferably formed by coupling said side metal layer with said bottom metal layer.

It is preferable that said concave portion have a side which is tapered so as to become broader from the bottom upward.

Furthermore, the present invention is a multilayer printed circuit board, wherein, on a resin-insulating layer that houses a semiconductor element, another resin-insulating layer and conductor circuit are formed with electrical connection through a via hole,
wherein said semiconductor element is embedded in the concave portion provided on the resin-insulating layer, the via hole connected to the semiconductor element is formed so as to be a form of filled via formed by filling conductive material, and the electromagnetic shielding layer is formed on the resin-insulating layer surrounding said concave portion.

In addition, the present invention is a multilayer printed circuit board, wherein, on a resin-insulating layer that houses a semiconductor element, another resin-insulating layer and conductor circuit are formed with electrical connection through a via hole,
wherein said semiconductor element is embedded in a concave portion provided on said resin insulating layer, said another resin insulating layer contains a fiber-based material, a via hole connected to semiconductor elements is further formed on the resin insulating layer, and an electromagnetic shielding layer is formed on the resin insulating layer surrounding said concave portion.

Said electromagnetic shielding layer is preferably formed by a side metal layer and a bottom metal layer.

It is preferable that said electromagnetic shielding layer be formed by a side metal layer, and the side metal layer be formed by a metal layer form in which metal coats the inner wall of multiple non-through holes, a form in which metal fills multiple non-through holes, or a form of multiple metal columns.

It is preferable that said side metal layer be of a form in which the inner wall of non-through holes is coated with a conductive metal, or a form in which non-through holes are filled with a conductive metal.

Said side metal layer is preferably formed so as to be of a form in which the inner wall of multiple non-through holes is coated with metal, a form in which multiple non-through holes are filled with metal, or a form of multiple metal columns, and at least one part of the side metal layer is coupled to another.

Preferably, said column is at least one form selected from among a cylinder, an elliptic cylinder, and a polygonal column.

It is preferable that said electromagnetic shielding layer include a bottom metal layer formed on a resin insulating layer located on the bottom or on the lower side of the bottom.

Said electromagnetic shielding layer is formed by coupling said side metal layer with said bottom metal layer.

Furthermore, the present invention is a multilayer printed circuit board, wherein, on a resin-insulating layer that houses a semiconductor element, another resin-insulating layer and a conductor circuit are formed with electrical connection through a via hole,
wherein said semiconductor element is embedded in a concave portion provided on the resin insulating layer, an electromagnetic shielding layer is formed on a resin insulating layer surrounding the concave portion, the electromagnetic shielding layer is formed by a bottom metal layer arranged on the lower side of the semiconductor elements, and the bottom metal layer is larger than said concave portion.

Said bottom metal layer is preferably formed by rolled copper foil.

Said electromagnetic shielding layer is preferably formed by a side metal layer and a bottom metal layer.

It is preferable that said electromagnetic shielding layer be formed by a side metal layer, and the side metal layer be formed to be at least one form selected from among a form in which the inner wall of multiple non-through holes is coated with metal, a form in which multiple non-through holes are filled with metal, or a form of multiple metal columns.

Said side metal layer is preferably a form in which the inner wall of multiple non-through holes is coated with metal or a form in which multiple non-through holes are filled with a conductive metal.

Plating, paste and the like may be used as said conductive metal.

It is preferable that said side metal layer be formed so as to be of a form in which the inner wall of multiple non-through holes is coated with metal, a form in which multiple non-through holes are filled with metal, or a form of multiple metal columns, and at least one part of the side metal layer is coupled to another.

Said columns are preferably at least one form selected from among a cylinder, an elliptic cylinder, and a polygonal column.

Said electromagnetic shielding layer is preferably formed by coupling said side metal layer with said bottom metal layer.

Furthermore, the present invention provides a method of manufacturing a multilayer printed circuit board, wherein, on a resin-insulating layer that houses a semiconductor element, another resin-insulating layer and a conductor circuit are formed with electrical connection though a via hole, said method at least comprising the steps of:
forming a first insulating resin base material, by forming at least a conductor circuit and a metal layer on the surface of a resin-insulating layer, and forming at least a conductor circuit and a conductor circuit non-formation area facing said metal layer on the other surface, and
furthermore, by forming a via hole for electrically connecting said conductor circuit on the other surface to said conductor circuit on the surface and a via hole for reaching said metal layer on the surface though a resin-insulating layer using plating on the outside of said conductor of circuit non-formation area on the other surface;
unifying by crimping a resin surface of a second insulating resin base material formed by attaching copper foil on the surface of a resin-insulating layer with said first insulating resin base material;
forming a conductor circuit on said second insulating resin base material and a via hole electrically connecting to the conductor circuit,
forming a concave portion from a resin-insulating layer surface on the conductor circuit non-formation area of said first insulating resin base material,
housing a semiconductor element within said concave portion and adhering it using an adhesive; and
forming another resin-insulating layer by coating said semiconductor element and a via hole.

Furthermore, the present invention provides a method of manufacturing a multilayer printed circuit board, wherein, on a resin-insulating layer that houses a semiconductor element, another resin-insulating layer and a conductor circuit are formed with electrical connection through a via hole, said method at least comprising the steps of:
forming a first insulating resin base material, by forming at least a conductor circuit and a metal layer on the surface of resin-insulating layer, and forming at least a conductor circuit on the other surface and a conductor circuit non-formation area facing said metal layer, and then forming a via hole for electrically connecting said conductor circuit using plating;

unifying by crimping the resin surface of a second insulating resin base material formed by attaching a copper foil on the surface of a resin-insulating layer with said first insulating resin base material;

forming a conductor circuit on the surface of said second insulating resin base material and forming a via hole using plating to electrically connect the conductor circuit to the via hole formed on said first insulating resin base material;

forming a concave portion on the conductor circuit non-formation area of said first insulating resin base material using plating;

forming a metal layer that coats said concave portion;

housing a semiconductor element within said concave portion and fixing it on a metal layer of said concave portion using an adhesive; and forming a via hole using plating for electrically connecting by coating said semiconductor element to form another resin-insulating layer.

DETAILED DESCRIPTION OF THE PREFERRED EMBODIMENTS

Figure 1A:
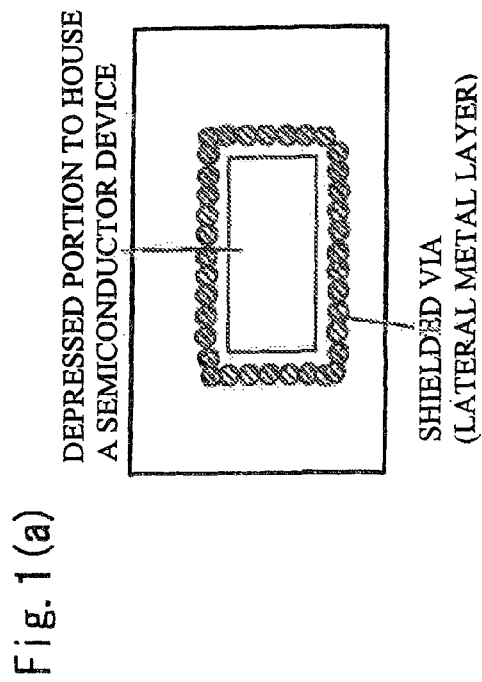
FIG. 1(a) to (c) are schematic drawings showing embodiments of an electromagnetic shielding layer of a multilayer printed circuit board according to the present invention.

In one embodiment of the multilayer printed circuit board according to the present invention, a multilayer printed circuit board, on which another resin insulating layer and a conductor circuit have been formed on a resin insulating layer that houses semiconductor elements to be connected electrically through a via hole, wherein said semiconductor elements are housed in a concave portion provided on a resin insulating layer, with an electromagnetic shielding layer formed around the concave portion.

In an embodiment of the invention, "around a concave portion" that houses semiconductor elements means a resin insulating layer located on the outside of the side of the concave portion, a resin insulating layer touching the bottom of the concave portion or located just below the bottom of the concave portion, a resin insulating layer located around an opening of the concave portion, or the inner wall of the concave portion (bottom+side).

Furthermore, "electromagnetic shielding layer" is a metal layer that isolates electrically, which is not connected to a conductor circuit (including a via hole) electrically to transmit electronic signals in a substrate, and means that it has electromagnetic shielding effects to protect semiconductor elements by preventing semiconductor elements from causing malfunction due to starting other semiconductor elements. Additionally, in some cases, if the shielding properties of semiconductor elements housed in the concave portion are ensured, an electromagnetic shielding layer may have electronic connectivity. The shielding layer according to the present invention is preferably formed by a side metal layer or bottom metal layer, or a side metal layer and bottom metal layer around the semiconductor elements.

In an embodiment of the invention, an electromagnetic shielding layer, as one form of the invention, is a side metal layer on a resin insulating layer located on the outside of a concave portion embedding semiconductor elements.

Said side metal layer may be formed by coating the inner wall surface of multiple non-through holes with metal, or by filling multiple non-through holes with metal.

Furthermore, said side metal layer may be formed as multiple metal columns formed on a resin insulating layer located on the outside of the concave portion.

As one embodiment for forming said non-through holes, it is possible to form them by creating an opening using a laser, photo-etching, and the like on the insulating layer located on the outside of the concave portion and coating the opening with a metal such as by plating, or by filling the opening with a conductive material such as paste for plating. For said metal, one or more than one kind of metal can be used.

As one embodiment for forming the abovementioned column, it is possible to form by driving a metal formed in advance as a predetermined form (cylinder or polygonal column) on an insulating layer located on the outside of the concave portion, or by forming an insulating layer located on the outside of the concave portion after aligning this metal in advance.

Said electromagnetic shielding layer may be of a form in which multiple non-through holes are coated with metal, a form in which multiple non-through holes are filled with metal, or a configuration in which at least one part of each side metal layer formed to be a column is coupled to another, which also prevents possible partial coupling.

Additionally, each side metal layer is formed such that a form in which multiple non-through holes are coated with metal, a form in which multiple non-through holes are filled with metal, or a form of columns can exist separately. Moreover, if needed, side metal layers of said each form can be mixed to configure an electromagnetic shielding layer.

Forming a side metal layer on the insulating layer of the outside of the concave portion of semiconductor elements can provide electromagnetic shielding effects. Said each side metal layer may or may not have electronic connectivity.

However, side metal layers formed as a form in which the inner wall of multiple non-through holes are coated with metal, a form in which multiple non-through holes are filled with metal, or a form of columns may not be connected electrically to a conductor circuit configuring an electronic circuit in a substrate or a via hole connected electrically to the conductor circuit. Hereinafter, as an explanation, a side metal layer of the abovementioned form is referred to as "shield-via". This shield-via is able to form an electromagnetic shielding area surrounding semiconductor elements embedded in the concave portion, thus reducing the effect of electromagnetic interference.

For example, if seen from the above, said shield-via is aligned linearly in parallel to an opening of the concave portion. Moreover, by zigzag aligning in parallel to the opening of the concave portion (cross alignment), an electromagnetic shielding layer is formed.

Furthermore, said shield-via is preferably a column. In this case, "column" means a cylinder (including a form in which the cross-section is an elliptic cylinder), polygonal column (including a form in which the cross-section is a triangle, square, rectangle, pentagon, hexagon, octagon and the like), and other spindly cylinders with irregular cross-sections. In particular, it is preferably formed so as to have a circular cross-section (including ellipses), and to be of a cylinder form which is spindly in the direction of the thickness of the substrate. Because the conductive layer of spindly cylinders with circular cross-sections can shield even a concentric area of the conductive layer, it is possible to ensure an electromagnetic shielding area not only in the direction of thickness of the semiconductor element but also the width direction. In other words, it makes it easy to obtain shielding effects towards not only the direction of thickness but also the width direction of a substrate. Furthermore, even when stress such as heat is applied to a shield-via, it can reduce stress concentration points, and it makes it difficult for defects such as cracks to be caused near this via.

Additionally, said shield-via can provide the same effect as a columnar form even when it is a form in which non-through holes are coated with metal or a form in which non-through holes are filled with metal.

Furthermore, said multiple shield-via can enhance shielding effects in the width direction of a substrate by being formed so as to be coupled to another and aligning so as to surround the side of a concave portion embedding semiconductor elements.

Figure 1B:
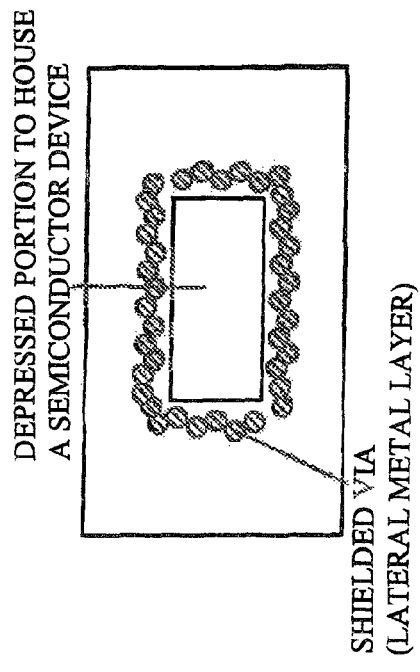

As shown in FIG. 1(a), said shield-vias may be coupled by being linearly aligned in parallel around an opening of a concave portion. Additionally, as shown in FIG. 1(b), they may be coupled by zigzag aligning (cross-alignment) in parallel around the opening of a concave portion.

In other words, in order to form an electromagnetic shielding layer by multiple shield-vias arranged along the periphery of the opening of a concave portion, linking shield-vias successively may take a form similar to a single metal plate. It may also be possible to stagger shield-vias (cross alignment) to create a form similar to a single metal plate. Any form can form an electromagnetic shielding layer by forming a metal layer without electronic connectivity to surround semiconductor elements, and thus, electromagnetic shielding effects toward the side direction of semiconductor elements embedded in a concave portion are provided.

Said shield-vias may be coupled to be of a sequential coupling configuration, in which all shield-vias are coupled or may be coupled so as to be of a partial coupling configuration, in which shield-vias are partially coupled. When compared to a mounted substrate without an electromagnetic shielding layer around the concave portion embedding semiconductor elements, electromagnetic shielding effects toward the side direction of semiconductor elements are provided.

In an embodiment of the invention, a form in which the bottom metal layer formed in a resin insulating layer is located on the bottom of a concave portion embedding semiconductor elements, or a form in which the bottom metal layer formed in a resin insulating layer is located just below the bottom of a concave portion is preferable as another form of electromagnetic shielding layer. Preferably, these metal layers are of sheet form.

It is preferable that such sheet-formed electromagnetic shielding layers are formed so as to be of the same size as the bottom of a concave portion embedding semiconductor elements, or of a slightly larger size or area than the bottom. This provides electromagnetic shielding effects of semiconductor elements toward the bottom.

The sheet-formed shielding layer is preferably connected to an electromagnetic shielding layer that is a shield-via formed on the outside of the concave portion. (Refer to FIGS. 1(a) to 1(b)). This provides electromagnetic shielding effects of semiconductor elements toward the side and bottom. As a result, the effects of electromagnetic interference can be controlled effectively along with problems such as malfunction.

In addition to the abovementioned electromagnetic shielding layer of shield-via form, in which conductive materials fill non-through holes or a sheet-formed electromagnetic shielding layer, a form in which conductive materials fill holes that are sometimes provided on the substrate or a form in which a metal plate is arranged thereon are acceptable.

Figure 1C:
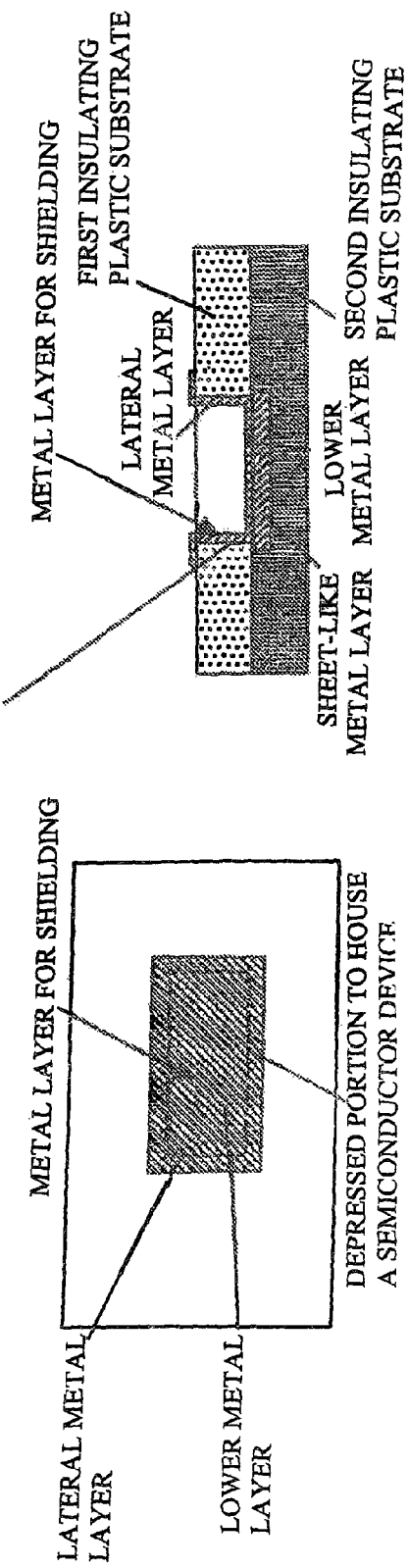

Furthermore, in an embodiment of the invention, as another electromagnetic shielding layer, as shown in FIG. 1(c), a form of metal layer formed on at least the inner wall of a concave portion embedding semiconductor elements is acceptable. In other words, a metal layer coating the bottom and side of a concave portion, or in addition to the metal layer coating the bottom and side of the concave portion, an electromagnetic shielding layer forming a metal layer extending from the upper end of the side of the concave portion to the periphery of the opening surrounds the entire outside surface (excluding the upper surface for which a connection pad is provided) of the package resin layer of semiconductor elements embedded in a concave portion, and thus, electromagnetic shielding effects toward the side and bottom of semiconductor elements are provided.

As metals for forming said electromagnetic shielding layer, it is preferable to use a metal in which one kind, or more than two kinds from nickel, copper and chromium are mixed.

As examples of these metals, copper, copper-chromium alloy, copper-nickel alloy, nickel, nickel-chromium alloy, chromium are preferable; however, other metals can also be used. The thickness of said metal layer is preferably approximately 5 μm to 20 μm, because a thickness under 5 μm might counter shielding effects. On the other hand, a thickness of over 20 μm may not improve shielding effects.

As a forming method of these metal layers, electroless plating, electroplating, sputtering, evaporation and the like are preferable. This is because they allow easy formation of a metal layer with uniform film thickness, making it easy to obtain electromagnetic shielding effects. Shielding layers formed using these means may be formed as a single layer or in multiple layers with more than two layers. In the case of forming multiple layers, it is possible to use the same method or different methods. Shielding layers can be formed according to the type, thickness of the metal layer and so on. These factors do not dramatically reduce electromagnetic shielding effects.

In an embodiment of the invention, it is preferable that a metal layer be formed on the bottom of the concave portion embedding semiconductor elements, and semiconductor elements be embedded through the metal layer. This is because this makes it possible to equalize the depth of the concave portion, and thus, semiconductor elements cannot be housed and embedded such that they are inclining in the concave portion. Therefore, even though a substrate that houses semiconductor elements is resin, when a via hole connected to a connection pad of semiconductor elements is formed on a resin insulating layer, it can be the predetermined via hole form, and further, the metal layer is formed in the resin insulating layer, resulting in influences such as thermal stress and external stress not often causing warping. As a result, it is easy to ensure electronic connectivity and connection reliability between a connection pad of semiconductor elements and a conductor circuit including the via hole connected to it. Additionally, the bottom metal layer may have a flat surface. This makes it easy to ensure the retention capacity of the concave portion and adhesiveness of the adhesive. If required, a rough surface may be formed on the bottom metal layer. The rough surface may ensure better adhesiveness because it adheres to the bottom metal layer and adhesive.

Furthermore, the bottom metal layer is preferably formed by copper because it is more workable for operations such as etching. In particular, it is preferable that rolled copper foil be used for forming. This is because it easily ensures the flatness of the bottom metal layer and ensures capacity to house semiconductor elements placed on the bottom metal layer or flatness of the surface of semiconductor elements.

More specifically, a resin substrate, in which a concave portion that houses semiconductor elements is formed, is mainly formed by resin material containing reinforcing material of a fiber-based material such as glass epoxy resin with glass fabric. Therefore, when a concave portion is formed using a spot-facing process, irregular concavity and convexity are formed on the bottom of the concave portion.

As a result, the depth of the concave portion tends to be irregular. In particular, at the approximate four corners of a concave portion in which the cross-section is formed to be rectangular, the depth of the concave portion tends to be shallow compared to other parts. Therefore, like the present invention, forming a metal layer on the bottom of the concave portion makes it easy to equalize the depth of the concave portion. In particular, when the cross-section of the concave portion is rectangular, it is easy to equalize the depth of the four corners.

Thus, when semiconductor elements are housed in a concave portion, semiconductor elements do not often incline. Therefore, even when a via hole connected to the pad of the housed semiconductor elements is formed on a resin insulating layer, a predetermined via hole can be formed. Furthermore, a metal layer is formed so as to be housed in a resin insulating layer, and thus, the influence of thermal stress and external stress do not often cause warping. As a result, for example, a poor connection cannot be easily occur between the connection pad of semiconductor elements and a conductor circuit, such as via holes, and therefore, the electronic connectivity and connection reliability cannot be easily decreased.

Moreover, it is easy to equalize the thickness of the adhesive layer formed between semiconductor elements and a metal layer, and thus, even when the adhesiveness of semiconductor elements is equalized and reliability tests such as heat cycle tests are then conducted, the adhesiveness is ensured for a long term.

In addition, said bottom metal layer may be larger than the bottom of the concave portion and formed on the outside of the concave portion. Therefore, a bottom metal layer formed in this way can achieve shielding effects of the semiconductor elements embedded in the substrate toward the bottom. Moreover, it is preferably provided together with a shield-via-formed electromagnetic shielding layer, which is the side metal. If needed, the bottom metal layer may be connected to the side metal layer. This makes it easier to ensure effects as an electromagnetic shielding layer.

Said bottom metal layer may be exposed by laser treatment. This makes the thickness of the concave portion equal.

The surface of the bottom metal layer in said concave portion is preferably a shiny surface. A shiny surface ensures adhesiveness between the bottom metal layer and semiconductor elements, and connectivity and reliability between semiconductor elements and via holes formed on other resin insulating layers. Additionally, it is easy to equalize the thickness of an adhesive layer formed between the bottom metal layer and semiconductor elements, and adhesiveness and electronic connectivity are easily ensured so that semiconductor elements are equally adhered. Furthermore, it is preferable that the adhesive layer touches the bottom periphery of the bottom and side of the semiconductor elements. Touching the adhesive layer to the bottom periphery of the bottom and side of the semiconductor elements ensures adhesiveness of semiconductor elements.

Figure 2:
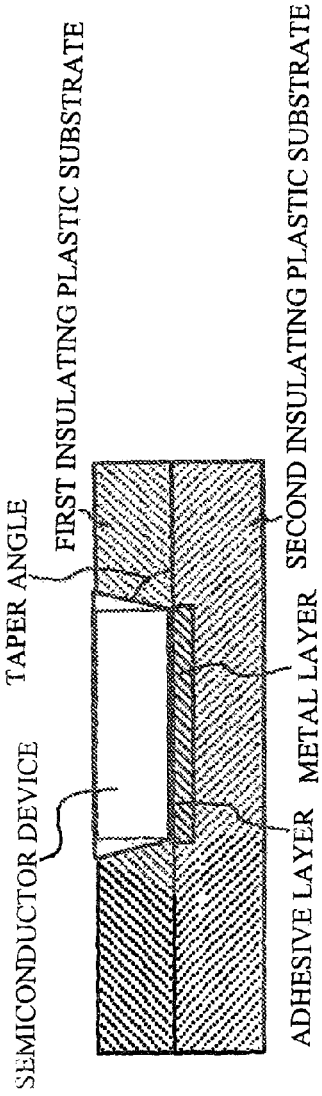
FIG. 2 is a schematic sectional drawing describing the tapered status of the concave portion, in which semiconductor elements of a multilayer printed circuit board according to the present invention are housed and embedded.

Moreover, the concave portion that houses semiconductor elements may have a side which is tapered as shown in FIG. 2. This is because semiconductor elements housed in a concave portion can reduce the stress with a resin material, which is the upper side of the taper, even though stress is applied toward the side (for example, thermal stress or external stress). Also, it is easy to insert semiconductor elements into a concave portion.

The tapering form of the concave portion preferably has a smaller angle between the side and bottom of between approximately 60 degrees and 90 degrees. This is so resin material on the upper side of the taper is reduced. Additionally, it is easy to insert semiconductor elements into a concave portion.

Furthermore, it is preferable that the space between the wall surface of the concave portion and the side of semiconductor elements is filled with a resin layer. Filling with resin can ensure connectivity and reliability of semiconductor elements in order to stabilize the semiconductor elements.

Furthermore, space between the wall surface of the concave portion and the side of the semiconductor elements may be filled with a resin layer and also unified with a resin insulating layer.

Thus, if another resin insulating layer in which a via hole is formed and the resin insulating layer filling the space between the wall surface of the concave portion and the side of the semiconductor elements are of the same material, thermal stress caused by the difference in the coefficient of thermal expansion between materials is reduced, defects such as cracks are reduced, and durability is ensured. As a result, it is easy to ensure connectivity and reliability of semiconductor elements.

Figure 3:
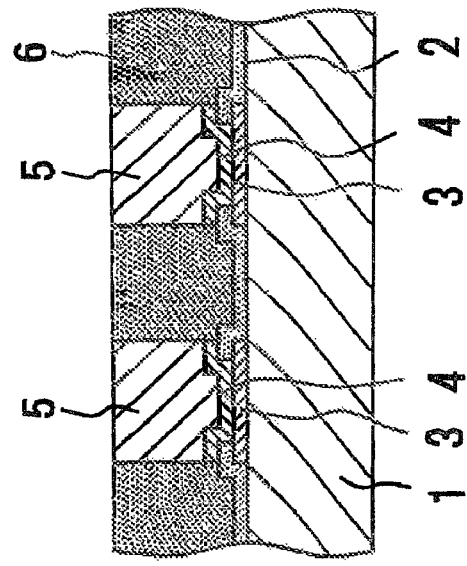
FIG. 3 is a schematic sectional drawing showing a columnar electrode formed on a pad of semiconductor elements of a multilayer printed circuit board according to the present invention.
Figure 4:
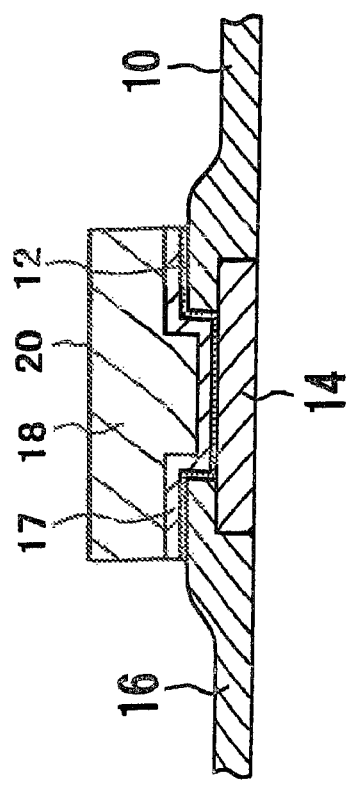
FIG. 4 is a schematic sectional drawing showing a mediation layer formed on a pad of semiconductor elements of a multilayer printed circuit board according to the present invention.

Moreover, in an embodiment of the invention, it is preferable to form columnar electrodes or a mediation layer on the pad of semiconductor elements as shown in FIG. 3 or FIG. 4. This makes it easy to electrically connect the pad of semiconductor elements and a via hole.

A pad of semiconductor elements is generally manufactured from aluminum and the like; however, particularly in the condition in which no metal layers are formed on the pad, the following problems sometimes occur. When a via hole is formed on the inter-layer insulating layer by photo-etching (process through exposure and development), resin is easily left on the surface of the pad after exposing and developing. In addition, attaching developing solution and chemicals (for example, plating solution, solution of acid, alkali and the like) used in the post-process sometimes caused tarnishing of the pads. Therefore, it was sometimes difficult to ensure electronic connectivity and connection reliability between the pad of the semiconductor elements and the via hole.

On the other hand, when via holes are formed using a laser, there is a danger of burning out aluminum pads. Also, when laser radiation is carried out under conditions so as not to burn out, resin might be left on the pad. Moreover, tarnishing and dissolution of the pad of semiconductor elements sometimes occurs via post-processing (for example, immersion processing in acid, oxidizer or etching solution, various anneal processes and so on). These make it difficult to ensure electronic connectivity and connection reliability around the pad of semiconductor elements.

Furthermore, pads of semiconductor elements are made to be about 40 μm in diameter and the via hole is made to have a larger diameter, making it easy differences in position to occur and causing defects such as disconnection between the pad and the via hole. Therefore, it is sometimes difficult to ensure electronic connectivity and connection reliability between the pad of the semiconductor elements and the via hole.

On the other hand, providing a mediation layer made from copper and the like on the pad of the semiconductor elements resolves problems due to forming via holes and creates solutions, thus preventing resin from being left on the pad and also preventing the pad from tarnishing and dissolving through post-processing. This makes it difficult to reduce electronic connectivity and connection reliability between the pad and the via hole. Furthermore, providing a mediation layer with a larger diameter than the die pad of the semiconductor elements enables the pad and via hole to connect without fail.

Furthermore, providing a mediation layer makes it easy to carry out operation checks and electric testing on semiconductor elements before or after semiconductor elements are embedded or housed in a printed circuit board. This is because a larger mediation layer than the pad of semiconductor elements is provided, and thus probe pins for testing can easily come in contact. Therefore, it is possible to evaluate good and bad products in advance and improve productivity and costs. Additionally, it makes it difficult for pad damage or scratches caused by the probe to occur. Thus, the forming transition on the pad of semiconductor elements allows semiconductor elements to be properly embedded and housed in a printed circuit board.

As a resin insulating layer that houses semiconductor elements, which is used in the embodiment of the present invention, hard lamination base materials selected from among glass fabric epoxy resin-based materials, phenolic resin-based materials, glass fabric bismaleimide triazine resin-based materials, glass fabric polyphenylene ether resin-based materials, aramid nonwoven fabric-epoxy resin based materials, and aramid nonwoven fabric-polyimide resin based materials can be used. Additionally, what is generally used in printed circuit boards can also be used. For example, two-sided or one-sided copper-clad laminate, a resin plate without metal film, resin film, or combinations of these materials can be used.

Said resin-based materials preferably have a thickness of approximately 20 μm to 350 μm. This is because it is easy to ensure the insulating property of inter-layer insulating layer and obtain inter-layer connectivity if the thickness is within this range.

According to the present invention, as a metal layer that houses a conductor circuit and semiconductor elements and metal layer that forms an electromagnetic shield, copper foil is preferably used. This is because it is mainly superior in shape workability and also electrical properties.

Preferably, copper foil for forming said conductor circuit has a thickness of approximately 5 μm to 20 μm. This is because if the thickness of the copper foil is within this range, it reduces deformation of the copper foil around the opening and makes it easy to form a conductor circuit when an opening for forming a via hole on the insulating resin-based material by laser processing, as hereinafter mentioned. Moreover, etching can make it easy to form a conductor circuit pattern with a fine line.

The thickness of copper foil used in the present invention may be adjusted by half-etching. In this case, it is preferable that the thickness of the copper foil attached to a resin insulating layer be larger than said value and the thickness of the copper foil after etching be adjusted to be approximately 5 μm to 20 μm.

Furthermore, when two-side copper-clad lamination is used, the thickness of the copper foil is within the abovementioned range; however, the thickness of each side may be different. This ensures strength so as not to interfere with post-processing.

Moreover, the thickness of the copper foil used for a metal layer formed on the bottom of said concave portion is preferably approximately 5 μm to 20 μm. This is because if the thickness of the copper foil is within this range, the risk of passing through the copper foil is reduced when the shape of the cavity is processed, and thus, there is no interference with formation of the metal layer on the bottom of the concave portion. Also, it makes it easy to process and form a metal layer by etching.

As a metal layer formed on said concave portion, in addition to copper, metals such as nickel, iron and cobalt may be used.

Additionally, the thickness of the copper foil as the sheet-formed metal layer that forms an electromagnetic shielding layer is preferably approximately 5 μm to 20 μm. This is because if the thickness of the copper foil is within this range, it is easy to ensure shielding effects.

As said insulating resin-based material and copper foil, in particular, it is preferable to use prepreg, in which epoxy resin is impregnated with glass fabric for making B-stage, and one-side or two-side copper-clad lamination obtained by laminating and hot pressing copper foil. This is because it is superior in positioning accuracy without differing from the wiring pattern and the position of the via hole while treating the copper foil after etching.

In an embodiment of the invention, a concave portion that is provided on a resin insulating layer for housing semiconductor elements can be formed by spot-facing processing, punching, laser processing and the like. Particularly, laser processing is preferable for forming. It easily forms concave portions of equal depth compared to other processes.

When said concave portion is formed by laser processing, an oxide film is formed on the surface of the metal layer (copper foil) by heat due to laser radiation, and adhesiveness may be improved. Also, the laser process can easily process concave portions so as to be of a tapered form.

Additionally, when concave portions are formed by spot-facing processing, a metal layer formed on the bottom of the concave portion works as a stopper so that the depth of concave portions is equal.

The depth of said concave portion depends on the thickness of the semiconductor elements to be housed, the thickness of columnar electrodes or the mediation layer that may be formed on the connection pad of the semiconductor elements, the thickness of the adhesive layer and so on. Also, a metal layer is formed on the bottom of the concave portion, making it easy to equalize the thickness of the adhesive layer provided between the semiconductor elements and the resin insulating layer. As a result, when semiconductor elements are housed, incline of the semiconductor elements is reduced.

Furthermore, it is possible to retain equal adhesiveness between the semiconductor elements and a resin insulating layer, and therefore, it is difficult to reduce the adhesiveness for a long term even though reliability tests such as heat cycle are conducted.

Additionally, concave portions for housing semiconductor elements are preferably formed so as to have the side which is tapered become broader from the bottom upward.

This form allows the reduction of stress on semiconductor elements that are housed in the concave portions even when stress is applied toward the side (for example, thermal stress and external stress). Furthermore, adhesives provided on the bottom of the semiconductor elements for fixing semiconductor elements do not often flow along the side of concave portions due to the capillary phenomenon, and thus it makes difficult to reduce adhesiveness of semiconductor elements to the bottom of the concave portions.

In an embodiment of the invention, as shown in FIG. 2, the angle of a taper is defined by the angle between the side and the bottom, and the angle of the taper is preferably between approximately 60 degrees and 90 degrees, and more preferably within the range of approximately 60 degrees to 85 degrees. This is because if the angle of the taper is within this range, the stress concentration on the side of the resin material of the taper is reduced. Moreover, it makes it easy to insert semiconductor elements into the concave portions As a result, electronic connectivity of semiconductor elements is easily ensured.

In an embodiment of the invention, as one embodiment of a resin insulating layer that houses semiconductor elements, two insulating resin-based materials as mentioned above are used, including a first insulating resin-based material in which a larger sized metal layer than the size of the bottom of concave portions for housing semiconductor elements on one surface and a second insulating resin-based material on a surface in which the metal layer of the first insulating resin-based material are laminated. Laser radiation for another surface of the first insulating resin-based material is applied. Multiple non-through holes for forming shield-vias are then formed in the concave portions for housing semiconductor elements and on the outside of the concave portion that reach the metal layer. After arranging the metal layer so as to be exposed from the bottom of the concave portion and the bottom of the non-through holes, by filling non-through holes with metal, a substrate for housing semiconductors, in which shield-vias as an electromagnetic shielding layer are formed on the outside of the side of the concave portion, is formed.

As another form, a first insulating resin in which a larger sized metal layer than the size of the bottom of the concave portions for housing semiconductor elements is laminated on one surface, and a second insulating resin-based material in which an opening equal to the size of the semiconductor elements is laminated in an area corresponding to the metal layer. After concave portions for housing semiconductor elements, in which one end of the opening is formed, laser radiation is applied on the other surface of the first insulating resin-based material so that multiple non-through holes that reach the metal layer are formed. After arranging the metal layer so as to be exposed from the bottom of the non-through holes, by filling non-through holes with metal, a substrate for housing semiconductors, in which shield-vias as an electromagnetic shielding layer are formed on the outside of the side of the concave portions, may be formed. Furthermore, as another embodiment, a first insulating resin-based material in which a larger sized metal layer than the bottom of the concave portion for housing semiconductor elements on one surface and a second insulating resin-based material on the surface in which the metal layer of the first insulating resin-based material is formed are laminated, laser radiation is carried out on another surface of the first insulating resin-based material so that concave portions for housing semiconductor elements that reach the metal layer are formed, and after the metal layer is arranged so as to be exposed from the bottom of the concave portions, a metal coating layer is formed by plating or sputtering on the entire inner wall surface of the concave portion such that a substrate for housing semiconductors, in which an electromagnetic shielding layer is formed, is formed.

In such an embodiment, the thickness of the first insulating resin-based material and second insulating resin-based material is preferably approximately 20 μm to 350 μm. This is because if the thickness is within this range, it is easy to ensure insulating properties of an inter-layer insulating layer and to form a via hole for inter-layer connection, in addition to reducing the decrease in electronic connectivity.

Additionally, as each insulating resin-based material, resin-based materials consisting of a single layer or resin-based materials consisting of multiple layers can be used.

After semiconductor elements are embedded in concave portions of said substrate for housing semiconductors, and an inter-layer resin insulating layer is then formed on one side or both sides of the substrate for housing semiconductors, and after a conductor circuit containing via holes, which connects electrically to semiconductor elements, is formed on the inter-layer resin insulating layer, and furthermore, another inter-layer resin insulating layer and the conductor circuit are laminated alternately such that a multilayer printed circuit board according to the present invention can be manufactured.

As semiconductor elements to be embedded in the concave portions of said substrate for housing semiconductors, either semiconductor elements in which a columnar electrode is formed on the connection pad in advance, or semiconductor elements in which a mediation layer that coats the connection pad can be used, and these semiconductor elements are connected electrically via the columnar electrodes or mediation layer to via holes that are provided on the inter-layer resin insulating layer.

Hereinafter, methods for manufacturing (1) semiconductor elements with columnar electrodes and (2) semiconductor elements with a mediation layer are described.

(1) A Method for Manufacturing Semiconductor Elements with Columnar Electrodes

Semiconductor elements with columnar electrodes used in the embodiment of the present invention refers to semiconductor elements that have columnar electrodes or rewiring.

As shown in FIG. 3, a connection pad 2 made from aluminum is formed on a semiconductor element 1 (silicon substrate) in a wafer-state, and on the upper surface, a protection film 3 (passivation film) on parts except for the center of the connection pad 2 is formed. In this state, the surface of the connection pad 2 is exposed on the center which is not coated with the protection film 3.

Secondly, a foundation metal layer 4 is formed on the entire upper surface of the semiconductor element 1. As the foundation metal layer, chromium, copper, nickel and the like can be used. A plating resist layer made from liquid resist is then formed on the upper surface of the foundation metal layer 4 and an opening is formed on a part corresponding to the connection pad of semiconductor elements of the plating resist layer.

Next, electrolytic plating is carried out on the foundation metal layer 4 as a current path so that columnar electrodes 5 are formed on the upper surface of the foundation metal layer in the opening of the plating resist layer. The plating resist layer is then separated, and furthermore, unnecessary parts of the plating resist layer are removed by etching using the columnar electrodes 5 as a mask, and then the foundation metal layer 4 remains below the columnar electrodes only.

Moreover, on the upper side of the semiconductor element 1, a sealing film 6 made from epoxy resin, polyimide and the like is formed. In this state, if the upper surface of the columnar electrodes 5 is coated with the sealing film 6, the surface is ground such that the upper surface of the columnar electrodes 5 is exposed. Next, through a dicing process, individual semiconductor chips (semiconductor element with columnar electrode) are obtained.

(2) Semiconductor Elements with a Mediation Layer

Mediation layer used in the embodiment of the present invention refers to an interposition layer for electrically connecting to via holes provided on the pad of the semiconductor elements. As shown in FIG. 4, by evaporating or sputtering the entire surface of semiconductor elements 10 such that they are embedded, a metal layer 12 (first thin film layer), which is conductive, is formed on the entire surface. As the metal, tin, chromium, titanium, nickel, zinc, cobalt, gold, copper and the like are acceptable. It is preferable to be formed so as to have a thickness of approximately 0.001 µm to 2.0 µm. This is because if the thickness of the metal layer is within this range, it is easy to form a metal layer with equal film thickness on the entire surface and reduce variation in the film thickness. If chromium is used, the thickness is preferably approximately 0.1 µm.

Said first thin film layer 12 coats a connection pad 14 and enhances adhesiveness between a mediation layer 20 and the connection pad 14 of semiconductor elements. Furthermore, coating the connection pad 14 of the semiconductor elements 10 with this metal prevents moisture from entering the interface, protects the pad from dissolution and corrosion, and make it difficult to reduce reliability.

As a metal for the first thin film layer 12, it is preferable that any one of chromium, nickel, and titanium be used. This is because they provide good adhesiveness between the connection pad 14 and the metal layer 12 and prevent moisture from easily entering the interface.

On the first thin film layer 12, a second thin film layer 17 is formed by sputtering, evaporating or electroless plating. As the metal, nickel, copper, gold, silver and the like are used. Because of its electrical properties, economic efficiency, and the fact that the thickened layer formed during post-processing is mainly formed by copper, the second thin film layer 17 is preferably formed using copper.

The reason for a second thin film layer being provided is that it is difficult for just the first thin film layer to remove lead for electrolytic plating so as to form a thickened layer mentioned later. The second thin film layer 17 is used as lead for thickening.

The thickness of the second thin film layer 17 is preferably within the range of approximately 0.01 µm to 5.0 µm. This is because if the thickness is within this range, it functions as lead and further, when it is etched, it prevents the first thin film layer of the lower layer from being etched to make space, thus making it difficult for moisture to enter, and does not cause a decrease in reliability.

Said second thin film layer 17 is thickened by electroless plating or electrolytic plating. As the metal used for forming, nickel, copper, gold, silver, zinc, iron and the like are used. Because of its electrical properties, economic efficiency, strength as a mediation layer and structural resistance, or the fact that conductive layers of build-up wiring layers are mainly formed by copper during post-processing, it is preferably formed by electrolytic copper plating.

The thickness of a thickened electrolytic copper plating layer 18 is preferably within the range of approximately 1 µm to 20 µm. This is because if the thickness is within this range, it prevents a decrease in connection reliability to via holes on the upper layer. Furthermore, when it is etched, undercutting does not occur and space on the interface between the mediation layer to be formed and via holes is not often made.

Additionally, in some cases, the first thin film layer may be thickened by plating directly, or laminated so as to create multiple layers.

After this, an etching resist is formed, exposed and developed, metal parts except for the mediation layer are exposed for etching, and the mediation layer 20, which consists of the first thin film layer 12, the second film layer 17 and the thickened layer 18, is formed on the pad of the semiconductor elements.

In addition to the method of manufacturing said mediation layer, after semiconductor elements are embedded in the concave portions of a substrate, a mediation layer may be formed, and also, on the metal layer formed on the semiconductor elements and core substrate, a dry film resist is formed for removing the parts relevant to the mediation layer and, after being thickened by electrolytic plating, the resist is separated so that, in the same way, a mediation layer may be formed on a die pad of the semiconductor elements using an etching solution.

Next, one embodiment for manufacturing a multilayer printed circuit board according to the invention is described specifically.

A. Manufacture of a Substrate for Housing Semiconductor Elements

In order to manufacture a multilayer printed circuit board according to the present invention, as a substrate for housing semiconductor elements, a form in which a first insulating resin-based material and second insulating resin-based material, in which copper is attached to one side or both sides of the insulating resin-based material, are laminated is used.

(1) For example, said first insulating resin-based material can be formed by two-sided copper-clad lamination. By laser radiation on one surface of such two-sided copper-clad lamination, an opening for forming via holes (non-through hole) and an opening for forming shield-vias (non-through hole) that reach the reverse of another copper through one copper foil and the resin insulating layer are formed.

At this time, an opening for forming shield-vias (non-through hole) is formed on the outside of the forming area of the concave portion for forming semiconductor elements, which is mentioned later, and neighboring openings are coupled with another.

Said laser radiation is carried out using pulsed oscillation carbon dioxide laser equipment, and preferably, under the processing conditions of a pulse energy of approximately 0.5 mJ to 100 mJ, a pulse duration of approximately 1 μs to 100 μs, a pulse interval of approximately more than 0.5 ms, a frequency of approximately 2000 Hz to 3000 Hz, and a shot number within a range of 1 to 5.

Under such processing conditions, the diameter of an opening which is to be formed is preferably approximately 20 μm to 250 μm. This is because if the diameter is within this range, it is easy to form via holes and there is less reduction of electronic connectivity. Furthermore, it makes it easy to fill with plating so that electronic connectivity is less often reduced and it also makes it easy to densify wirings.

Moreover, in order to form openings for forming via holes and openings for forming shield-vias on the copper-clad lamination by laser radiation, either a direct laser method, in which laser radiation is carried out so as to form openings on both copper foil and insulating resin-based materials, or a conformal method, in which laser radiation is carried out on insulating resin-based materials after removing copper foil parts relevant to openings for forming via holes in advance may be used.

(2) In order to remove resin left in openings that was formed in said process, it is preferable to carry out desmear treatment.

This desmear treatment is carried out by wet processing such as chemical processing of acids or oxidizers (for example, chromic acid and permanganic acid), and dry processing such as oxygen plasma discharge treatment, corona discharge treatment, ultraviolet laser treatment, or excimer laser treatment.

A method for carrying out the desmear treatment is selected depending on the smear amount expected by the type of insulating resin-based material, thickness, diameter of openings, and laser conditions.

(3) Openings for forming via holes and openings for forming shield-vias (side metal layer) of said desmeared substrate are plating-processed with copper foil as a plating lead, openings for forming via holes and openings for forming shield-via are filled completely with electrolytic copper plating so that via holes (filled vias) and shield-vias are formed.

Additionally, in some cases, after electrolytic copper plating processing, swelled electrolytic copper plating on the top of the openings of the substrate may be removed and planarized by belt-sander grinding, puff grinding, etching and the like.

(4) Resist layers are formed on both sides of said first insulating resin-based material, and through the process of exposure and development, a resist non-forming part is etched using etching solution made from copper chloride. After this, the resist is separated so that, on one surface of the first insulating resin-based material, a conductor circuit containing a via hole area is formed, location marks for positioning and so on are formed, and on another surface, a metal layer of a size relevant to semiconductor elements, a conductor circuit containing a via hole area, location marks for positioning and so on are formed.

Moreover, multiple shield-vias are formed so as to be coupled with another, with one end exposed to one surface of the first insulating resin-based material and the other end connected to the surface of the metal layer so as to form an electromagnetic shielding layer.

(5) On the surface of the side where the metal layer of said first insulating resin-based material is formed, a second insulating resin-based material is laminated.

For example, a second insulating resin-based material is formed by which a copper foil is lapped on prepreg, adhesive layer, so that a laminated body is formed by thermocompressing it on the one side of the first insulating resin-based material.

(6) On the surface in which a metal layer of first insulating resin-based material that consists said laminated body is provided, laser radiation is carried out in the same way as (1) above so as to form an opening for forming via holes, which goes through the copper foil surface of the second insulating resin-based material and also reaches a conductor circuit containing a via hole area formed on the first insulating resin-based material.

Preferably, the conditions for processing the opening for forming via holes include a pulse energy of approximately 0.5 mJ to 100 mJ, a pulse duration of approximately 1 μs to 100 μs, a pulse interval of approximately more than 0.5 ms, a frequency of approximately 2000 Hz to 3000 Hz, and a shot number within a range of 1 to 10.

In addition, the diameter of the openings for forming via holes that are formed under the abovementioned processing conditions is preferably approximately 20 μm to 250 μm. This is because if the diameter is within this range, it is technically easy to form via holes and to reduce the decrease in electronic connectivity. Moreover, it is easy to fill with plating, reducing the decrease in electronic connectivity and making it easy to densify wirings.

(7) In order to remove the remaining resin in the opening for forming via holes that is formed in the process of (6) above, desmear treatment is carried out in the same way as (2) above.

(8) Next, with the surface of said first insulating resin-based material coated with a protection film, electrolytic copper plating processing with the copper foil as lead is carried out for the copper foil surface of said desmeared substrate, and electrolytic copper plating fills the opening so as to form filled vias.

Additionally, in some cases, after electrolytic copper plating processing, it is possible to remove and planarize swelled electrolytic copper plating on the top of the opening for forming via holes of the substrate by belt-sander grinding, puff grinding, etching and the like.

Also, it is possible to form electrolytic plating through electroless plating. In this case, copper, nickel, silver and the like may be used for electroless plating film.

(9) On said electroless copper plating film, a resist layer is formed. Regarding the resist layer, it is possible to coat or attach what is made to be a film in advance. On this resist, a mask, in which a circuit is drawn in advance, is placed for exposing and developing so as to form an etching resist layer. A metal layer in etching resist non-forming parts is etched, and a conductor circuit containing a via hole area is formed. After this, the protection film, which was attached in the abovementioned process, is separated.

As the etching solution, at least one kind of solution selected from among sulfuric acid—hydrogen peroxide, persulfate, copper chloride and ferric chloride is preferable.

As a pre-process for forming a conductor circuit by etching said copper foil, it is possible to adjust the thickness by etching the entire surface of the copper foil in advance so as to easily form a fine pattern.

Preferably, via hole areas, which are a part of said conductor circuit, have an internal diameter almost the same as the diameter of via holes or a larger external diameter than the diameter of via holes such that the diameter of the area is within a range of approximately 50 μm to 350 μm. This is because diameters of the area which are within this range do not often cause interference with the connection between via holes and the area, or interference with the density.

(10) Next, on the surface area (area for housing semiconductor elements) on the side with a metal layer of the first insulating resin-based material, and the opposite side, for example, openings that reach the surface of the metal layer through a resin layer are formed by laser processing, and concave portions, where the metal layer is exposed from the openings, are formed so as to be a substrate for forming semiconductor elements. If needed, through resist forming processing and etching treatment processing, concave portions, where the metal layer is exposed, can be formed.

For example, on the laminated body with said first insulating resin-based material and said insulating resin-based material, by laser radiation using pulsed oscillation carbon dioxide laser equipment, openings, which reach the surface of the metal layer through a resin layer from the surface of the first insulating resin-based material 30, are formed, and concave portions for housing or embedding semiconductor elements are formed.

Preferably, the conditions for processing concave portions for housing said semiconductor elements include a pulse energy of approximately 0.5 mJ to 100 mJ, a pulse duration of approximately 1 μs to 100 μs, a pulse interval of approximately more than 0.5 ms, a frequency of approximately 2000 Hz to 3000 Hz, and a shot number within a range of 1 to 0.

According to such laser processing, concave portions that embed semiconductor elements are formed, and the metal layer (copper foil in this case) is exposed on the bottom of said concave portions.

B. Housing and Embedding Semiconductor Elements

(11) Semiconductor elements are embedded in the substrate for housing semiconductor elements that is obtained in the processes in (1) to (10) in the abovementioned A.

For the semiconductor elements to be embedded, as mentioned above, either semiconductor elements, in which columnar electrodes are formed on the connection pad in advance, or semiconductor elements, in which a mediation layer for coating the connection pad is formed, may be used; however, the case in which the latter is used is described hereto.

This mediation layer is a mediation layer that is provided for connecting the pad of semiconductor elements and a conductor circuit containing via holes of a printed circuit board directly. It is formed by a thin film layer being provided on the die pad, and furthermore, a thickened layer being provided on the thin film layer, and preferably, it is formed by at least more than two layers.

In addition, this mediation layer is preferably formed to be of a larger size than the die pad of the semiconductor elements. The size enables the mediation layer to be easily positioned with the die pad, and as a result, it is possible that electronic connectivity with the die pad is improved, and also via holes are processed by laser radiation or photo-etching without damaging the die pad. Therefore, semiconductor elements can be certainly embedded and housed in a printed circuit board and electrically connected to it.

Moreover, on the mediation layer, a metal layer consisting of a conductor circuit of a printed circuit board can be formed.

Additionally, in addition to the manufacturing methods mentioned above, on a metal layer formed on the entire surface of the side where a connection pad of semiconductor elements or on the substrate for housing semiconductor elements where semiconductor elements are embedded, a resist made from dry film is formed so as to remove parts relevant to the mediation layer, and then the metal layer is thickened by electrolytic plating, and finally, the resist is separated so that a mediation layer can be formed on the connection pad of semiconductor elements using an etching solution in the same way.

(12) After providing a resin insulating layer on a substrate that houses and embeds semiconductor elements, by carrying out the same processes as (1) to (4) in the abovementioned A, it is possible to form via holes that connect to a mediation layer formed on the connection pad of embedded semiconductor elements electrically, via holes that connect to a conductor circuit containing via holes formed on a substrate for housing semiconductor elements electrically, and the outside conductor circuit. Furthermore, by laminating a resin insulating layer and copper foil and repeating the same processes as (1) to (9) in the abovementioned A, further multilayer printed circuit boards can be obtained.

In the abovementioned method, although resin insulating layers are laminated successively to make the resin insulating layer multilayered, if needed, by laminating one unit of a circuit substrate such that there are more than two layers and thermocompressing them all together, a multilayer printed circuit board, which makes the resin insulating layer multilayered, may be provided.

(13) Next, on the surface of the outermost circuit substrates, solder resist layers are formed respectively. In this case, the solder resist composition coats the entire external surface of the circuit substrate, and after drying the coating, a photomask film, on which an opening of a solder pad is drawn, is placed on the coated film so as to expose and develop such that solder pad openings where the conductive pad part located just above via holes of the conductor circuit is exposed, are formed respectively. In this case, a dry filmed solder resist layer can be attached so that an opening may be formed by exposing, developing or laser processing.

On the solder pad exposed from the non-forming part of said mask layer, a corrosion-resistant layer such as nickel-gold is formed. At this time, the thickness of the nickel layer is preferably approximately 1 μm to 7 μm and the thickness of the metal layer is preferably approximately 0.01 μm to 0.1 μm.

In addition to the above, nickel-palladium-gold, gold (single layer), silver (single layer) and the like may be formed. After the corrosion-resistant layer is formed, the mask layer is separated. This provides a printed circuit board that combines a solder pad in which a corrosion-resistant layer is formed and a solder pad in which a corrosion-resistant layer is not formed.

(14) On the solder pad part exposed from the opening of the solder resist, which was obtained in the process of (13) above, immediately above the via holes, a solder body is provided. According to melting/solidification of the solder body, a solder bump is formed, or a conductive ball or a conductive pin are joined to the pad part using a conductive adhesive or solder layer so as to form a multilayer circuit substrate.

As a method of providing said solder body and solder layer, a solder transfer process or print process can be used.

The solder transfer process hereto is a method for transferring, by which solder foil is put on the prepreg and the solder foil is etched leaving a part relevant to the opening so as to form a solder pattern as a solder carrier film, and the solder carrier film is laminated and heated such that the solder pattern touches the pad after the solder resist opening of the substrate is coated with flux. On the other hand, the print process is a method in which a print mask (metal mask) with an opening in the part relevant to the pad is placed on a substrate, and solder paste is printed and heated. As the solder that forms such a solder bump, Sn/Ag solder, Sn/In solder, Sn/Zn solder and Sn/Bi solder can be used, with a melting point that is preferably lower than the melting point of conductive bump connecting each circuit substrate that is laminated.

As described, according to the abovementioned embodiments of a multilayer printed circuit board of the present invention, semiconductor elements are housed in concave portions placed on a resin insulating layer of a resin substrate, and an electromagnetic shielding layer is formed around the concave portions such that the semiconductor elements embedded in the concave portions can be shielded, and therefore, problems such as signal delay and malfunction can be reduced.

Furthermore, according to embodiments of the present invention, forming a metal layer on the bottom of the concave portions makes it easy to equalize the depth of the concave portions. In particular, if the cross-section of the concave portion is rectangular, it is easy to equalize the depth of the concave portion around the four corners. Therefore, when semiconductor elements are housed in the concave portion, the number of inclined semiconductor elements is reduced. As a result, when via holes connected to the pad of the housed semiconductor elements are formed on a resin insulating layer, the via holes can be formed in a predetermined form. Furthermore, the metal layer is formed on the resin insulating layer, thus reducing warping caused by the influence of thermal stress and external stress, and as a result, for example, it reduces poor connections between the connection pad of the semiconductor elements and the conductor circuit of via holes and so forth, making it difficult to decrease the electronic connectivity and connection reliability.

Embodiment 1-1

(1) Preparation of Base Materials

Firstly, print substrates, which consist of a substrate for housing semiconductor elements, are manufactured. The print substrate consists of a first insulating resin-based material 30 and a second insulating resin-based material 40, and is formed by laminating these base materials. As one example of a material of the print substrate, prepreg, in which epoxy resin is impregnated with glass fabric to be stage B, and one-sided or two-sided copper-clad lamination, which is obtained by laminating and hot-pressing copper foil, are used as the starting material.

Figure 5A:
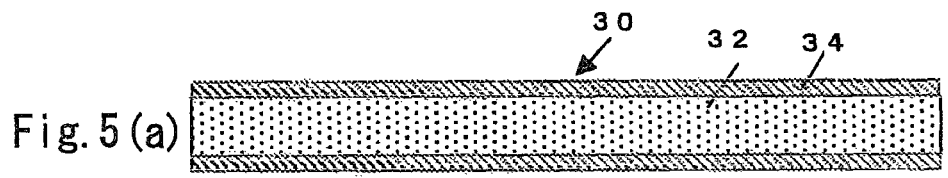
FIG. 5(a) to (g) are schematic sectional drawings showing a part of the process for manufacturing a multilayer printed circuit board according to Embodiment 1-1 of the present invention.

As said first insulating resin-based material 30, two-sided copper-clad lamination is formed by attaching a copper foil 34 with a thickness of 15 µm to both sides of a resin insulating layer 32 with a thickness of 60 µm. It is possible to use the copper foil 32 of the lamination, which is thicker than 15 µm, or to adjust the thickness of the copper foil to 15 µm by etching. (Refer to FIG. 5(a)).

(2) Formation of Via Holes and Openings for Forming Shield-Vias

Figure 5B:
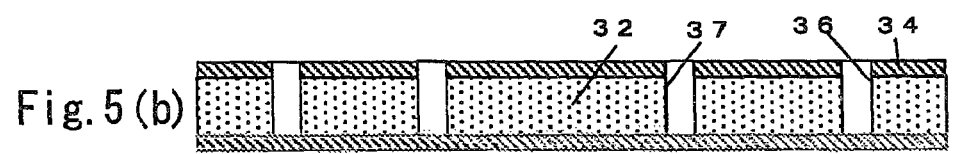

Carbon dioxide laser radiation is applied to one surface of copper foil of said first insulating resin-based material 30 so as to form an opening for forming via holes 36 and an opening for forming shield-vias 37 that reach the other surface of copper foil through a copper foil 34 and resin insulating layer 32 (Refer to FIG. 5(b)).

At this time, the opening for forming shield-vias 37 (non-through hole) is formed on the outside of the formation area of the concave portions for housing semiconductor elements, which is described later, and neighboring openings are coupled with each other in series.

Furthermore, the inside of the opening is desmeared by chemical treatment using permanganic acid.

According to this embodiment, in order to form the opening for forming via holes 36 and the opening for forming shield-vias 37, using a high-peak short-pulse oscillation carbon dioxide laser beam machine by Hitachi Via Mechanics, Ltd., on the glass fabric epoxy resin-based material, in which the thickness of the base material is 60 µm, a laser beam is directly applied to the copper foil at a speed of 100 holes/second under the radiation conditions below so as to form the opening for forming via holes 36 and the opening for forming shield-vias 37 with a diameter of 75 µm.

(Radiation Conditions)
Pulse energy: 0.5 to 100 mJ
Pulse duration: 1 to 100 µs
Pulse interval: 0.7 ms
Frequency: 2000 Hz (3) Formation of Electrolytic Copper Plating On the copper surface where the opening for forming via holes 36 and the opening for forming shield-vias 37 of the desmeared first insulating resin-based material 30 are provided, electrolytic copper plating process with copper foil as lead is carried out under the plating conditions below.

| [Electrolytic plating solution] | | | |
|---|---|---|---|
| Sulfuric acid | | | 2.24 mol/l |
| Copper sulfate | | | 0.26 mol/l |
| Additive (accelerator) | A | (reaction | 11.0 ml/l |
| Additive (inhibitor) | B | (reaction | 10.0 ml/l |

| [Electrolytic plating conditions] | |
|---|---|
| Current density | 1 A/dm$^2$ |
| Time | 65 minutes |
| Temperature | 22 ± 2° C. |

Figure 5C:
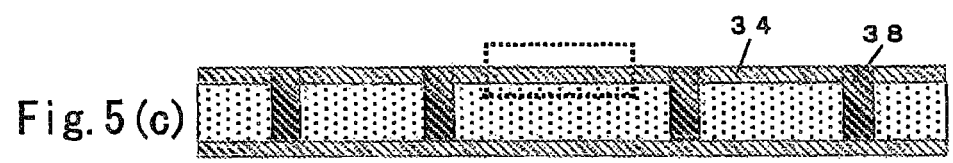

According to such plating process, Additive A accelerates formation of electrolytic copper plating film in the opening, and conversely, Additive B has it attached on the mainly copper foil part and inhibits formation of the plating film. Moreover, when the inside of the opening is filled with electrolytic copper plating so as to be the same height as the copper foil, Additive B is adhered, and therefore, formation of the plating film is inhibited in the same way as the copper foil part. By this means, the inside of the opening is completely filled with electrolytic copper plating, and also, the electrolytic copper plating and copper foil, which are exposed from the opening, are formed so as to be nearly flat. (Refer to FIG. 5(c)).

In addition, the thickness of the conductive layer formed by copper foil and electrolytic plating film can be adjusted by etching. In some cases, the thickness of the conductive layer can be adjusted using physical methods such as belt sander grinding and puff grinding.

(4) Formation of a Conductor Circuit (Including Filled Via), Shield-filled Via, which is the Side Metal of the Electromagnetic Shielding Layer, and Metal Layer On the copper foil 34 and the copper plating film of the first insulating resin-based material 30, which was processed in (3) above, an etching resist layer (figure omitted) is formed using photosensitive dry film. In other words, an etching resist layer is formed on the copper foil surface of both sides of the first insulating resin-based material 30. The thickness of the resist layer is within a range of approximately 15 µm to 20 µm, a resist non-formation part is formed on the copper foil through exposure/development processing using a mask, on which a conductor circuit containing an area and a relevant-sized metal layer to semiconductor elements are drawn.

Next, the resist non-formation part is etched using an etching solution made from hydrogen peroxide solution/sulfuric acid so as to remove copper plating film and copper foil, which are relevant to the non-formation part.

After that, by separating the resist using alkaline solution, a conductor circuit 41 containing an area of the filled vias 39, a metal layer 42, and a shield-filled via 47 are formed. If needed, dummy patterns, alignment marks, product recognition symbols and the like can be formed.

Additionally, in this process, multiple shield-vias 47 are coupled in series as shown in FIG. 1(a), and are connected to the surface of the metal layer 42 to form an electromagnetic shielding layer.

Accordingly, conductor circuits 41 are formed on the surface and reverse surface of the first insulating resin-based material 30, and also filled vias 39, which connect these conductor circuits 41 electrically, and furthermore, the metal layer 42 that touches the semiconductor elements is formed such that circuit substrates, in which shield-vias 47 that are connected to the surface of the metal layer 42 and consist of the electromagnetic shielding layer are formed, are obtained.

Figure 5D:
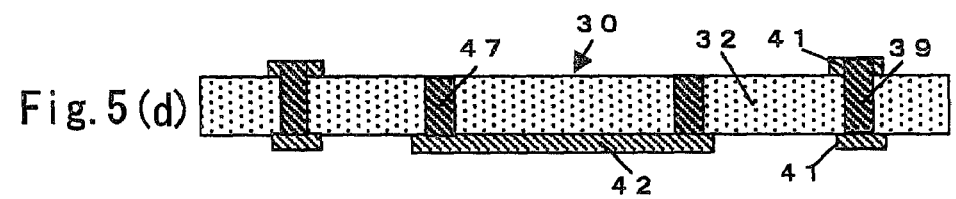

Additionally, the metal layer 42, which is formed on the circuit substrate, is formed on the reserves surface of the first insulating resin-based material, and the copper foil part on the surface of the circuit substrate, which is relevant to the area where concave portions that house semiconductor elements are formed, is removed by etching. (Refer to FIG. 5(d)).

(5) Lamination of First Insulating Resin-Based Materials and Second Insulating Resin-Based Materials As a second insulating resin-based material 40 that is laminated on said first insulating resin-based material 30, one-sided copper-clad lamination formed by attaching the copper foil 44 with a thickness of 15 µm to one surface of the resin insulating layer 43 with a thickness of 60 µm is used.

Figure 5E:
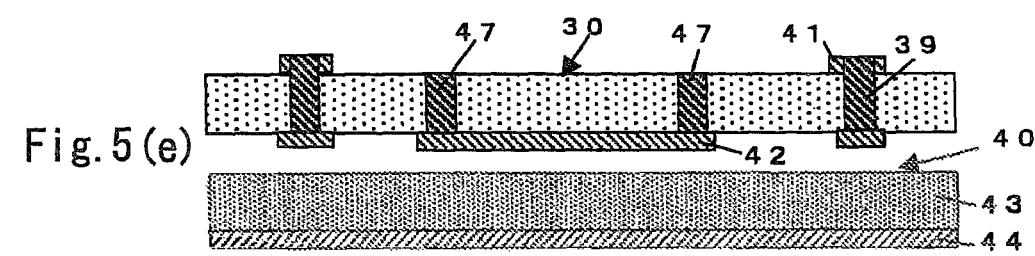

Said second insulating resin-based material 40 is laminated with the surface where copper foil is not formed, making contact with the surface where the metal layer 42 of the first insulating resin-based material 30 is formed. The first insulating resin-based material 30 and the second insulating resin-based material 40 are both laminated by heat-crimping under the following conditions (Refer to FIG. 5(e)).

| (Crimping conditions) | |
|---|---|
| Temperature: | 150 to 180° C. |
| Pressing pressure: | 100 to 200 kgf/cm$^2$ |
| Crimping time: | 5 to 10 minutes |

Moreover, in this embodiment, the first insulating resin-based material 30 and the second insulating resin-based material 40 are laminated as single layers; however, they may be laminated as multiple layers with more than two layers.

(6) Formation of Openings for Forming Via Holes

Figure 5F:
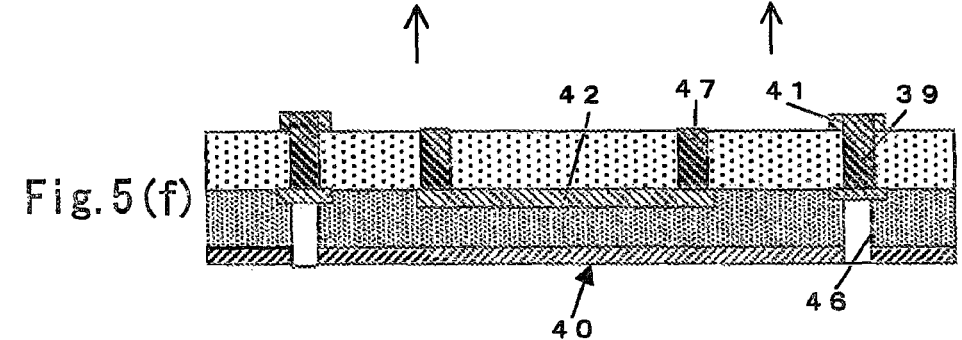

Carbon dioxide laser radiation is applied on the surface, where copper foil is formed, on said second insulating base material 40, so as to penetrate the copper foil 44 and also the resin insulating layer 43 so that openings for forming via holes 46 that reach the surface of the conductor circuit 41 containing via-land of filled vias 39 provided on said first insulating resin-based material 30 are formed (Refer to FIG. 5(f)). Furthermore, the inside of the openings are desmeared by chemical treatment using permanganic acid.

In this embodiment, in order to form openings for forming via holes on the second insulating base material 40, a high-peak short-pulse oscillation carbon dioxide laser beam machine by Hitachi Via Mechanics, Ltd. is used. On the copper foil 44 attached to the glass fabric epoxy resin-based material with a base material thickness of 60 µm of the second insulating base material 40, laser beam radiation is directly applied at a speed of 100 holes/second so as to form openings for forming via holes 46 with a diameter of 75 µm under the following radiation conditions.

| (Radiation conditions) | |
|---|---|
| Pulse energy: | 0.5 to 100 mJ |
| Pulse duration: | 1 to 100 µs |
| Pulse interval: | 0.7 ms |
| Frequency: | 2000 Hz |

(7) Formation of Electrolytic Copper Plating Film

After the surface of said first insulating resin-based material 30 is coated by attaching a protection film 48, electrolytic cooper plating processing with copper foil as lead is carried out on the copper foil surface, which has been desmeared, on the second insulating resin-based material 40 using an electrolytic plating solution of the following composition.

| [Electrolytic plating solution] | | | |
|---|---|---|---|
| Sulfuric acid | | | 2.24 mol/l |
| Copper sulfate | | | 0.26 mol/l |
| Additive accelerator) | A | reaction | 11.0 ml/l |
| Additive inhibitor) | B | reaction | 10.0 ml/l |

| [Electrolytic plating conditions] | |
|---|---|
| Current density | 1 A/dm$^2$ |
| Time | 65 minutes |
| Temperature | 22 ± 2° C. |

According to such a plating process, Additive A accelerates formation of the electrolytic copper plating in the openings, and conversely, Additive B adheres to the copper foil part to inhibit formation of plating film. In addition, when the inside of the openings are filled with electrolytic copper plating so as to be of the same height as the copper foil, Additive B is adhered, and thus, formation of the plating film is inhibited in the same way as the copper foil part. Accordingly, the inside of the openings are filled with electrolytic copper plating, and also electrolytic copper plating, which is exposed from the openings, and the copper foil is formed so as to be nearly flat.

Moreover, the thickness of a conductive layer formed by copper foil and electrolytic plating film may be adjusted by etching. In some cases, physical methods such as belt sander grinding and puff grinding may be used for adjusting the thickness of the conductive layer.

(8) Formation of Conductor Circuits and Filled Vias

On the copper foil 44 of the second insulating resin-based material 40 and copper plating, which were processed in (7) above, an etching resist layer (figure omitted) is formed using photosensitive dry film. The thickness of the resist layer is within a range of approximately 15 µm to 20 µm, and a resist non-formation part is formed on the copper foil through processes of exposure/development using a mask, on which conductor circuits containing a land of filled vias are drawn.

Next, the resist non-formation part is etched using an etching solution made from hydrogen peroxide solution/sulfuric acid so as to remove the copper plating film and copper foil that are relevant to the non-formation part.

Figure 5G:
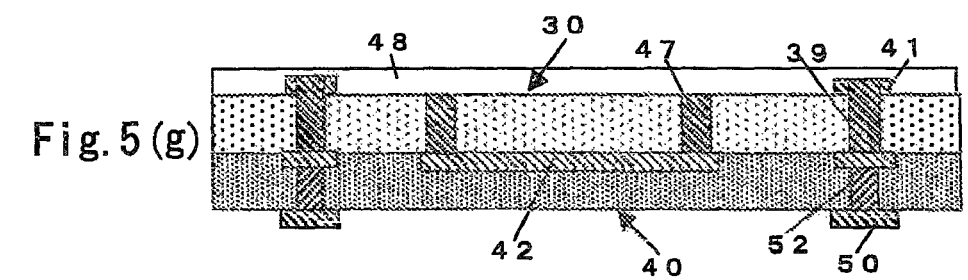

After this, the resist is separated, and the protection film 48 attached on the surface of the first insulating base material 30 in the process of (7) above is then separated, and thus, on one surface of the second insulating base material 40, a conductor circuit 50 is formed, and also filled vias 52 that connect these conductor circuits to the land 41 of the filled vias 39 provided on the first insulating base material 30 are formed (FIG. 5(g)). If needed, dummy patterns, alignment marks, product recognition symbols and the like can be formed.

(9) Formation of Concave Portions for Housing Semiconductor Elements

Figure 6A:
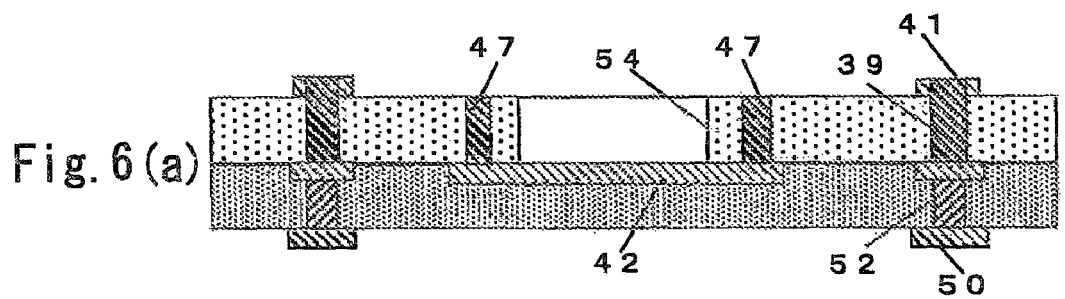
FIG. 6(a) to (d) are schematic sectional drawings showing a part of the process for manufacturing a multilayer printed circuit board according to Embodiment 1-1 of the present invention.

In the process of (4) above, carbon dioxide laser radiation is applied on the resin part where the copper foil part was removed by etching so as to form openings that reach the surface of a metal layer through a resin layer such that the metal layer is exposed in the openings, and, depending on the side of the openings and the surface of the metal layer (bottom), concave portions 54 for embedding semiconductor elements 55 is formed (Refer to FIG. 6(a)).

According to the embodiment, in order to form concave portions 54 for housing semiconductor elements on the first insulating resin-based material 30, a high-peak short-pulse oscillation carbon dioxide laser beam machine by Hitachi Via Mechanics, Ltd. is used. For areas in which copper foil on the surface of the first insulating resin-based material is removed, laser beam radiation is applied on a glass fabric epoxy resin-based material with a base material thickness of 60 µm under the following radiation conditions so as to form a concave portion 54, which is slightly larger than the size of the semiconductor elements to be housed and has a depth of approximately 100 µm, for housing semiconductor elements.

(Radiation Conditions)
Pulse energy: 0.5 to 100 mJ
Pulse duration: 1 to 100 µs
Pulse interval: 0.7 ms
Frequency: 2000 Hz Additionally, the metal layer 42 is exposed on the bottom of the concave portion 54 for housing semiconductor elements formed by laser processing, and the depth of the concave portion 54 is almost equal and the shape of the four corners is not a circular arc.

(10) Housing Semiconductor Elements with Columnar Electrodes

For semiconductor elements 55 for housing and embedding in the concave portion 54 of substrates for housing semiconductor elements that are manufactured according to the processes of (1) to (9) above, semiconductor elements with columnar electrodes, which are manufactured according to the process of the following (a) to (d), are used.

(a) Preparation of Silicon Substrate

A connection pad is formed on a wafer silicon substrate (semiconductor substrate); a protection film (passivation film) is formed on the connection pad excluding the center part; and the center of the connection pad is exposed through the openings formed on the protection film.

(b) Formation of Foundation Metal Layer

On the entire upper surface of the silicon substrate, a foundation metal layer made of copper with a thickness of 2 µm is formed by sputtering.

(C) Formation of Columnar Electrodes

Next, on the upper surface of the foundation metal layer, a dry film resist made of a photosensitive resin such as acrylic resin is laminated so as to form a layer with a thickness of 110 µm. The height of columnar electrodes to be formed is set at around 100 µm.

After that, openings are formed on the resist through processes of exposure/development using a mask, on which an opening is drawn on a part relevant to the pad on the plating resist layer. Furthermore, by electrolytic copper plating with the foundation metal layer as a plating current path, columnar electrodes made from copper are formed on the upper surface of the foundation copper layer in the openings of the plating resist layer.

Finally, after the plating resist layer is separated and unnecessary parts on the foundation metal layer are etched using columnar electrodes as a mask, the foundation metal layer remains only below the columnar electrodes.

(d) Formation of Sealing Film

On the upper surface of the silicon substrate obtained in (c) above, a sealing film, which is an insulating resin made from epoxy resin or polyimide, is formed. In this state, if the upper surface of the columnar electrodes is coated with the sealing film, the surface is ground properly such that the upper surface of the columnar electrodes are exposed.

Next, individual semiconductor chips (semiconductor equipment) are obtained by dicing processing. At this time, semiconductor elements with columnar electrodes are formed so as to have a thickness of 100 µm. On the lower surface of the semiconductor element 55, which is manufactured according to the processes of (a) to (d) above, a thermosetting adhesive, for example, an adhesive made from thermosetting resin, in which a part of epoxy resin is acrylized, is applied so as to form an adhesive layer 56 with a thickness of 30 µm to 50 µm.

Figure 6B:
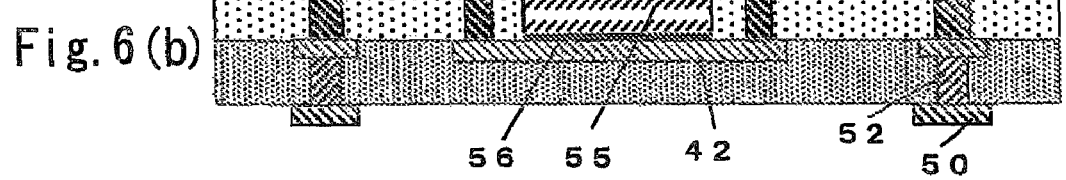

After housing in the concave portion 54 of the substrate for housing semiconductor elements, the adhesive layer 56 is hardened by heat processing at 100° C. to 200° C. By this means, the substrate 60 that embeds semiconductor elements 55 is obtained (Refer to FIG. 6(b)).

At this time, a tip of the columnar electrodes 58 of the semiconductor elements and the upper surface of the substrate are almost on the same surface. In other words, the semiconductor element 55 does not incline.

(11) Lamination Process

Figure 6C:
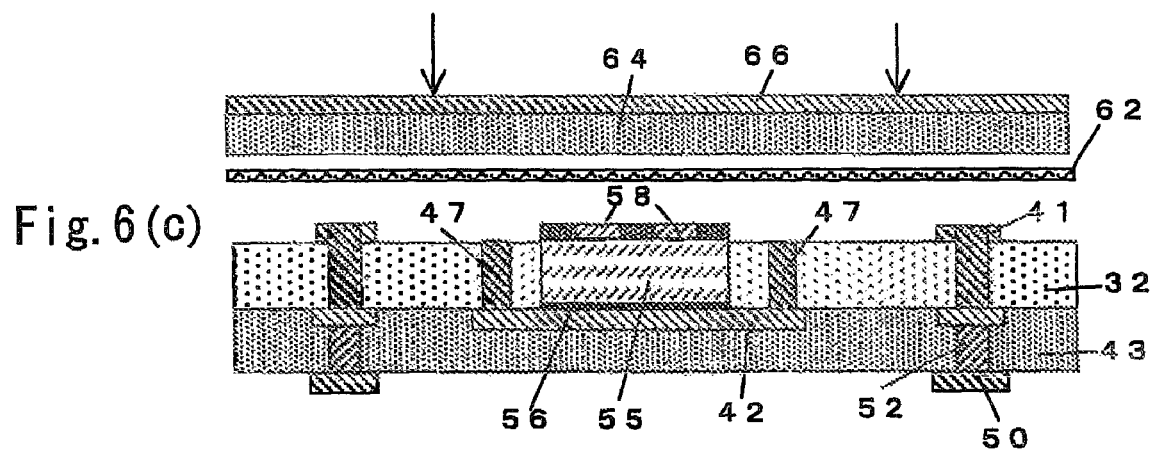
Figure 6D:
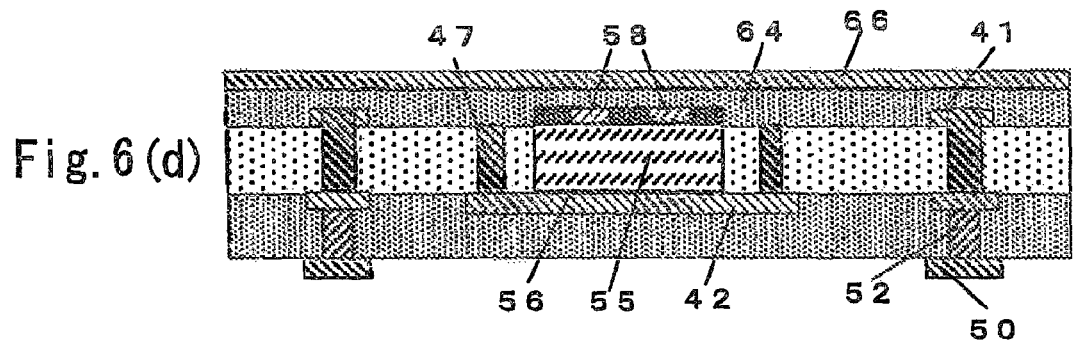
Figure 7A:
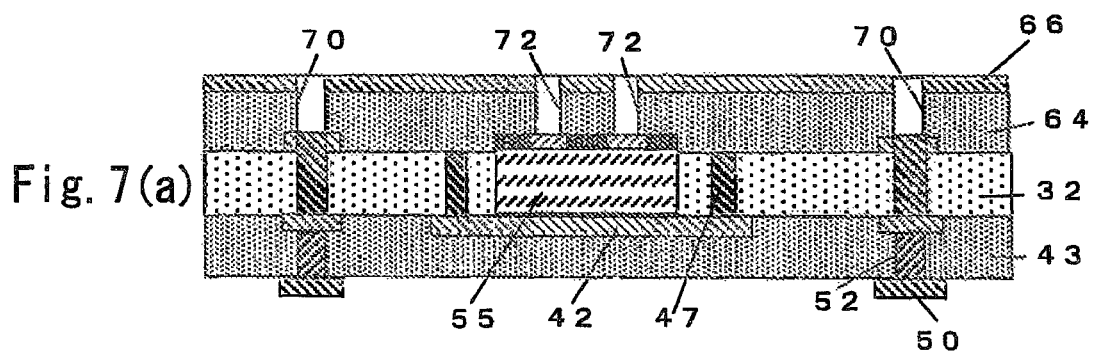
FIG. 7(a) to (d) are schematic sectional drawings showing a part of the process for manufacturing a multilayer printed circuit board according to the Embodiment 1-1 of the present invention.
Figure 7B:
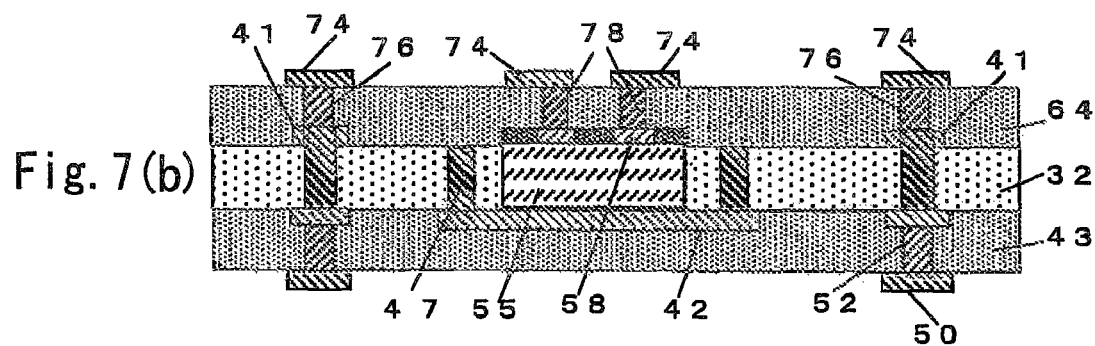
Figure 7C:
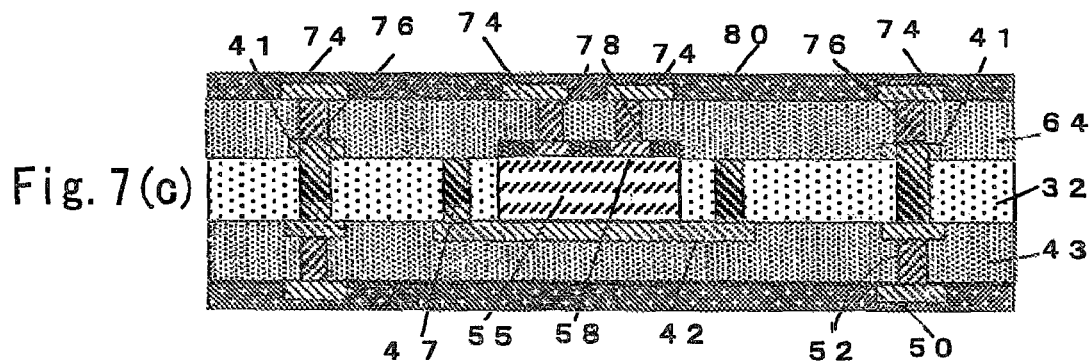
Figure 7D:
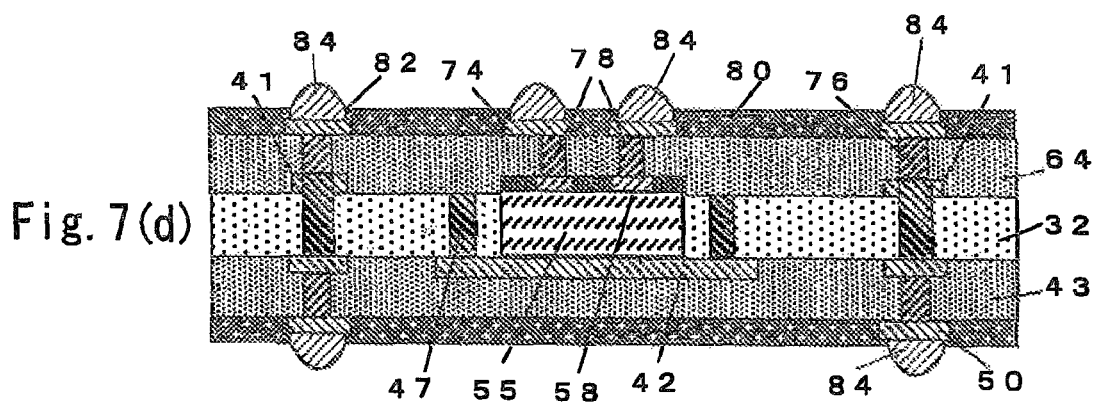
Figure 8A:
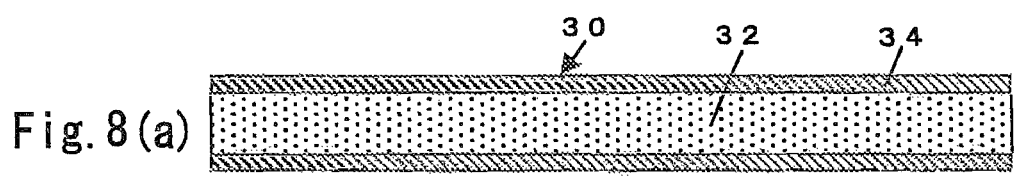
FIG. 8(a) to (g) are schematic sectional drawings showing a part of the process for manufacturing a multilayer printed circuit board according to Embodiment 3-1 of the present invention.
Figure 8B:
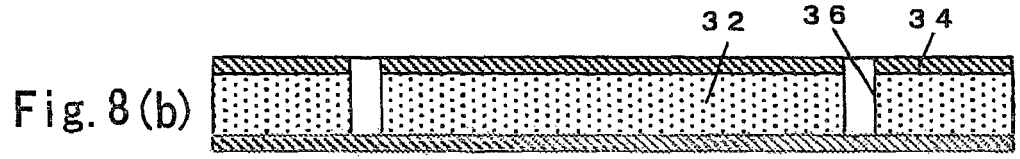
Figure 8C:
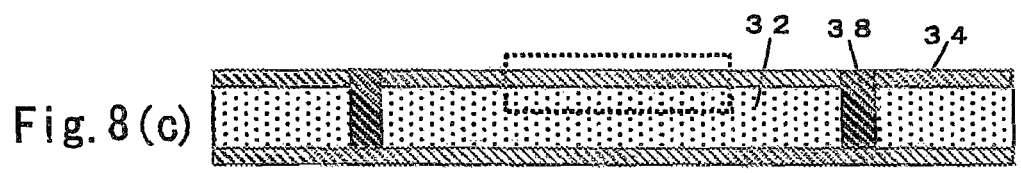
Figure 8D:
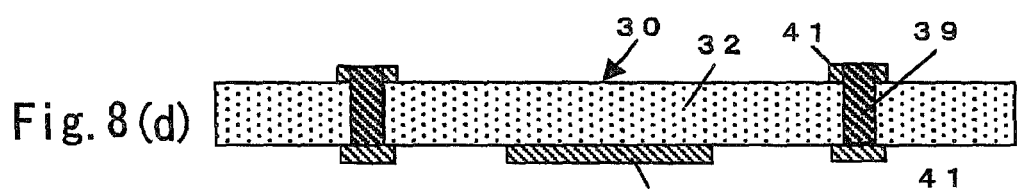
Figure 8E:
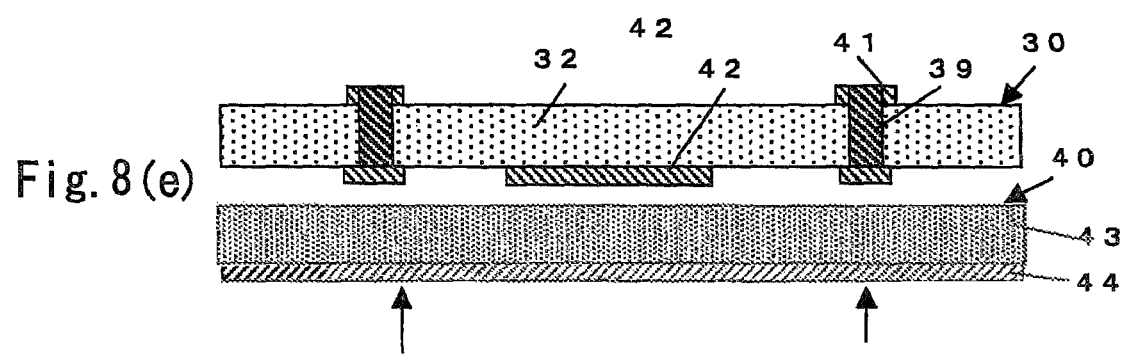
Figure 8F:
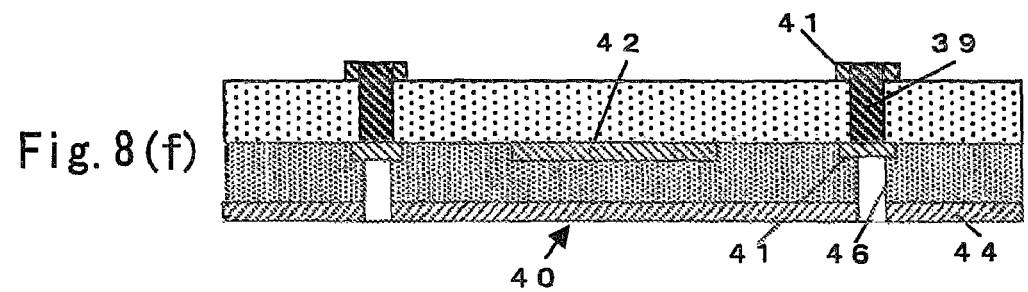
Figure 8G:
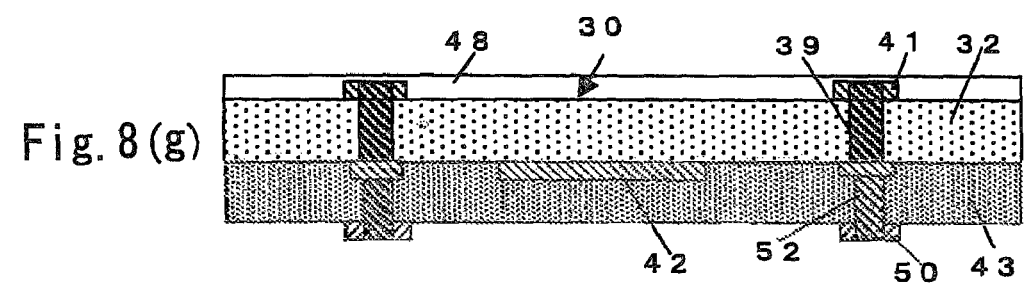

An adhesive layer 62 such as prepreg is placed on the substrate 60 that was obtained in (10) above, and a one-sided copper-clad lamination is formed by attaching a copper foil 66 with a thickness of 15 µm laminated on one surface of the resin insulating layer 64 with a thickness of 60 µm (Refer to FIG. 6(c)) so as to make them multilayer under the following conditions (Refer to FIG. 6(d)).

(Pressing Conditions)
Temperature: 80 to 250° C.
Pressure: 1.0 to 5.0 kgf/om²
Pressing time: 10 to 60 minutes

(12) Formation of Openings for Forming Via Holes

In the same way as the process of (6) above, the conductor circuit 41 containing via-land that is formed on the first insulating resin-based material comprising the substrate for housing semiconductor elements through the copper foil 66 and the resin insulating layer 64, and openings for forming via holes 70 and 72 that respectively reach the columnar electrode 58 provided on the pad on semiconductor elements, are formed (Refer to FIG. 7(*a*)). The radiation conditions in this case are the same as the process of (6) above. Furthermore, the inside of the openings are desmeared by chemical treatment using permanganic acid.

(13) Formation of Electrolytic Copper Plating

Electrolytic copper plating processing with copper foil as lead is carried out on the copper foil surface, in which the inside of the openings has been desmeared, using electrolytic copper plating solution of the following composition.

[Electrolytic Plating Solution]
Sulfuric acid: 2.24 mol/l
Copper sulfate: 0.26 mol/l
Additive A (reaction accelerator): 10.0 ml/l
Additive B (reaction inhibitor): 10.0 ml/l
[Electrolytic Plating Conditions]
Current density: 1 A/dm$^2$
Time: 65 minutes
Temperature: 22±2° C.

According to such a plating process, Additive A accelerates formation of an electrolytic copper plating film in the openings, and conversely, Additive B adheres to mainly copper foil parts so as to inhibit formation of a plating film. Additionally, when the inside of the openings are filed with electrolytic copper plating so as to be almost the same height as the copper foil, Additive B is adhered, and thus, formation of a plating film is inhibited in the same way as the copper foil part. Accordingly, the inside of the openings are completely filled with electrolytic copper plating, and also the electrolytic copper plating and copper foil that are exposed from the openings are formed so as to be nearly flat. Moreover, it is possible to adjust the thickness of a conductive layer made from copper foil and electrolytic plating film. In some cases, the thickness of the conductive layer may be adjusted using physical methods such as belt sander grinding and puff grinding.

Accordingly, via holes connected to conductor circuits and via holes connected to the host of semiconductor elements are formed, by which the insides of the openings are completely filled with electrolytic copper plating.

(14) Formation of Conductor Circuits

On copper foil and copper plating through a process of (13) above, an etching resist layer is formed using photosensitive dry film. The thickness of the resist layer is within a range of 15 μm to 20 μm, and a resist non-formation part is formed on the copper foil through processes of exposure/development using a mask, on which conductor circuits containing a land of filled vias are drawn.

Next, the resist non-formation part is etched using an etching solution made from hydrogen peroxide solution/sulfuric acid so as to remove copper plating film and copper foil that are relevant to the non-formation part.

After that, by separating the resist using an alkaline solution, a conductor circuit 74 is formed on the resin insulating layer 64 provided by coating the substrate for housing semiconductor elements 60, and also filled vias 76 that connect the conductor circuit 74 to the land 41 of the filled vias electrically and filled vias 78 that are connected electrically to the columnar electrodes 58 provided on the pad of semiconductor element 55 are formed respectively. Additionally, if needed, dummy patterns, alignment marks, product recognition symbols and the like can be formed.

Furthermore, if needed, repeating the processes of (11) to (14) above can provide a further multilayer printed circuit board.

In order to make such a multilayer, it is possible to laminate so as to make the orientation of the via holes the same or opposite. Additionally, combinations other than the above are acceptable in order to make a multilayer.

(15) Formation of Solder Resist Layer

On the surface of the circuit substrate located on the top layer or bottom layer of the multilayer substrate, which was obtained according to the process of (1) to (14) above, a solder resist layer 80 is formed. By attaching a film-formed solder resist or coating with varnish, the viscosity of which was adjusted in advance, a solder resist layer 80 with a thickness of 20 μm to 30 μm is formed on the substrate.

Next, after dry processing at 70° C. for 20 minutes and at 100° C. for 30 minutes, by adhering the side, where the chromium layer was formed, soda lime glass substrate with a thickness of 5 mm, on which a circular pattern (mask pattern) of the opening of the solder resist was drawn by the chromium layer, was exposed with ultraviolet rays of 1000 mJ/om$^2$ and DMTG development was carried out. Furthermore, by heat-processing under the conditions of 120° C. for 1 hour and 150° C. for 3 hours, a solder resist layer 80 (20 μm thick) with an opening 82 relevant to the pad part is formed. Additionally, if needed, it is possible to provide a rough layer on the surface of the circuit substrate located on the top layer and bottom layer of the multilayer substrate.

In this case, a mask layer, which was formed so as to be of a dry film form, was made from photosensitive resin on the solder resist layer. By attaching the mask layer formed so as to be like a film or by coating with varnish, the viscosity of which was adjusted in advance, a mask layer with a thickness of 10 μm to 20 μm is formed on the solder resist layer.

Next, after dry processing at 80° C. for 30 minutes, the side, where the chromium layer is formed, of the soda lime glass substrate with a thickness of 5 mm, on which a formation pattern (mask pattern) of the mask layer is drawn by the chromium layer, is adhered to the solder resist layer, and is exposed with ultraviolet rays of 800 mJ/cm$^2$ and DMTG development is carried out. Furthermore, by heat processing at 120° C. for 1 hour, a solder resist layer (20 μm thick) is formed.

(16) Formation of Corrosion-Resistant Layer

Then, the substrate, where the solder resist layer 80 is formed, is immersed in an electroless nickel plating solution of pH=5 made from nickel chloride 30 g/l, sodium hypophosphite 10 g/l, and sodium citrate 10 g/l for 20 minutes so as to form a nickel plating layer with a thickness of 5 μm at the opening.

Furthermore, the substrate is immersed in an electroless plating solution made from potassium gold cyanide 2 g/l, ammonium chloride 75 g/l, sodium citrate 50 g/l and sodium hypophosphite 10 g/l at 93° C. for 23 seconds so as to form a gold plating layer with a thickness of 0.03 μm on the nickel plating layer and a metal coating layer (figure omitted) formed by a nickel plating layer and gold plating layer.

(17) Formation of Solder Layer

Accordingly, on the solder pad that is exposed from the opening 82 of the solder resist layer 80 coating the multilayer circuit substrate on the top layer, by printing Sn/Pb solder with a melting point of approximately 183° C. or solder paste made from Sn/Ag/Cu, and reflowing at 183° C., a solder layer 84 is formed.

Embodiment 1-2

With the exception of the process for embedding semiconductor elements 55 with a mediation layer, which is manufactured in the following processes of (a) to (c) in the concave portion 42 of the substrate for housing semiconductor elements, a multilayer printed circuit board is manufactured via the same process as Embodiment 1-1.

(a) Entirely on the semiconductor elements with a protection film on the connection pad and wiring pattern, two layers, a chromium thin film with a thickness of 0.1 μm and a copper thin film layer with a thickness of 0.5 μm, are successively formed in a vacuum chamber by sputtering.

(b) After that, a resist layer made from dry film is formed on a thin film layer. A mask with drawn parts forming a mediation layer is placed on the resist layer, and a resist non-formation part is formed through processes of exposure and development. Also, a thickened layer (electrolytic copper plating film) with a thickness of 9 μm is provided on the resist non-formation part by electrolytic copper plating.

(c) After removing the plating resist using an alkaline solution, a mediation layer is formed on the pad of semiconductor elements by removing the metal layer below the plating resist using an etching solution. Accordingly, a semiconductor element is obtained which is 5 mm long, 5 mm wide and 100 μm thick.

Embodiment 1-3

With the exception of the process for forming a shield-via, which is a side metal layer, so as to be of a zigzag alignment (cross-alignment) as shown in FIG. 1(c), a multilayer printed circuit board is manufactured via the same processes as Embodiment 1-1.

Embodiment 1-4

With the exception of the processes for forming the shield-via, which is a side metal layer, so as to be of a zigzag alignment (cross-alignment) as shown in FIG. 1(c) and embedding semiconductor elements 55 with a mediation layer in the concave portion 42 of the substrate for housing semiconductor elements, a multilayer printed circuit board is manufactured via the same process as Embodiment 1-1.

Embodiment 2-1

In the process of (9) above in Embodiment 1-1, under the following laser radiation conditions, a multilayer printed circuit board is manufactured via the same processes as Embodiment 1-1 with the exception of the process for forming a taper with an angle of 85 degrees on the side of the concave portion for housing semiconductor elements.
(Radiation Conditions)
Pulse energy: 95 mJ
Pulse duration: 90 μs
Pulse interval: 0.7 ms
Frequency: 2000 Hz Embodiment 2-2

In the process of (9) above in Embodiment 1-1, under the following laser radiation conditions, a multilayer printed circuit board is manufactured via the same processes as Embodiment 1-1 with the exception of the processes for forming a taper with an angle of 85 degrees on the side of the concave portion for housing semiconductor elements and embedding semiconductor elements 55 with a mediation layer in the concave portion 42 of the substrate for housing semiconductor elements.

(Radiation Conditions)
Pulse energy: 80 mJ
Pulse duration: 100 μs
Pulse interval: 0.7 ms
Frequency: 2000 Hz Embodiment 2-3

With the exception of the process for forming a shield-via, which is a side metal layer, so as to be of a zigzag alignment (cross-alignment) as shown in FIG. 1(c), a multilayer printed circuit board is manufactured via the same processes as Embodiment 2-1.

Embodiment 2-4

With the exception of the processes for forming a shield-via, which is a side metal layer, so as to be of a zigzag alignment (cross-alignment) as shown in FIG. 1(c) and embedding semiconductor elements 55 with a mediation layer in the concave portion 42 of the substrate for housing semiconductor elements, a multilayer printed circuit board is manufactured via the same process as Embodiment 2-1.

Embodiment 3-1

(1) A substrate, in which the concave portion 54 for housing semiconductor elements is formed on the first insulating resin-based material 30, is manufactured via the same process of processes of (1) to (9) in Embodiment 1-1 with the exception that that the shield-via, which is a side metal layer, is not formed (Refer to FIG. 8(a) to FIG. 9(a)).

(2) A resist layer 49 is formed by laminating dry film resist with a thickness of 15 μm on both sides of said substrate so as to form a resist non-formation part, on which a concave portion 54 provided on the first insulating resin-based material 30 and the margin of its opening are exposed.

(3) On the surface of said resist non-formation part, by placing a palladium catalyst, catalyst nuclei are adhered on the surface of the inner wall and the margin of the opening of the concave portion 54.

(4) Next, a substrate, on which the catalyst is put via the abovementioned process, is immersed in an electroless copper plating solution with the following composition so as to form an electroless copper plating film 57a with a thickness of 0.5 μm to 3.0 μm on the surface of the inner wall and opening margin of the concave portion 54.
(Electroless Copper Plating Solution)
Copper sulfate: 0.03 mol/l
EDTA: 0.200 mol/l
HCHO: 0.18 g/l
NaOH: 0.100 mol/l
α,α'-bipyridyl: 100 mg/l
Polyethylene glycol: 0.10 g/l
(Plating Conditions)
At a solution temperature of 34° C. for 40 minutes (5) Next, under the following plating conditions with an electrolytic copper plating solution of the following composition, electrolytic copper plating 57b is formed on the resist non-formation part by electrolytic copper plating.
(Electrolytic Copper Plating Solution)
Sulfuric acid: 2.24 mol/l
Copper sulfate: 0.26 mol/l
Additive: 19.5 ml/l
(Product name: Capalacid GL manufactured by Attech Japan)
(Electrolytic Plating Conditions)
Current density: 1 A/dm$^2$
Time: 35±5 minutes
Temperature: 22±2° C.

Figure 9A:
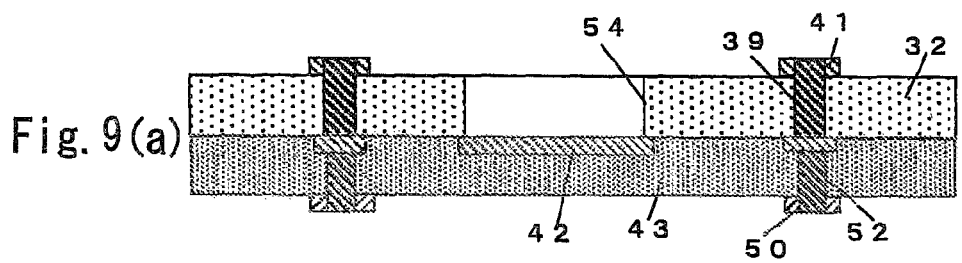
FIG. 9(a) to (e) are schematic sectional drawings showing a part of the process for manufacturing a multilayer printed circuit board according to Embodiment 3-1 of the present invention.
Figure 9B:
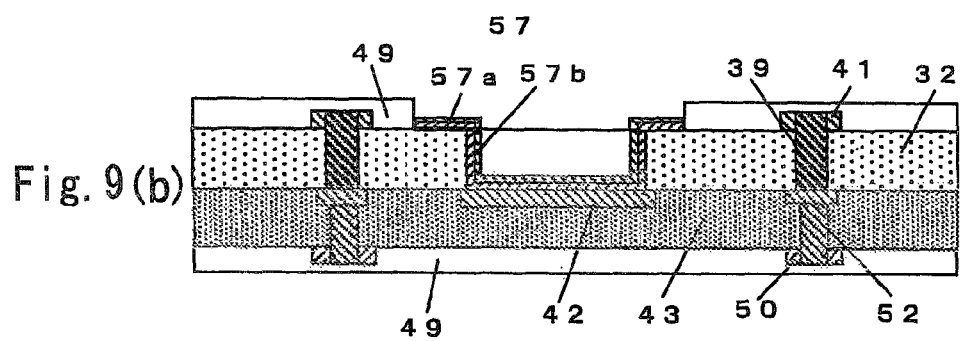
Figure 9C:
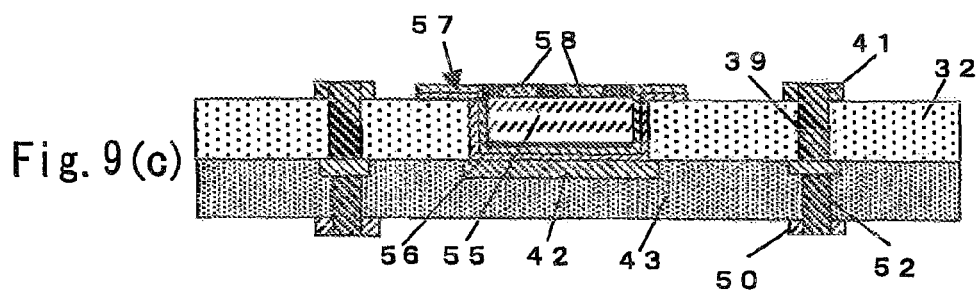
Figure 9D:
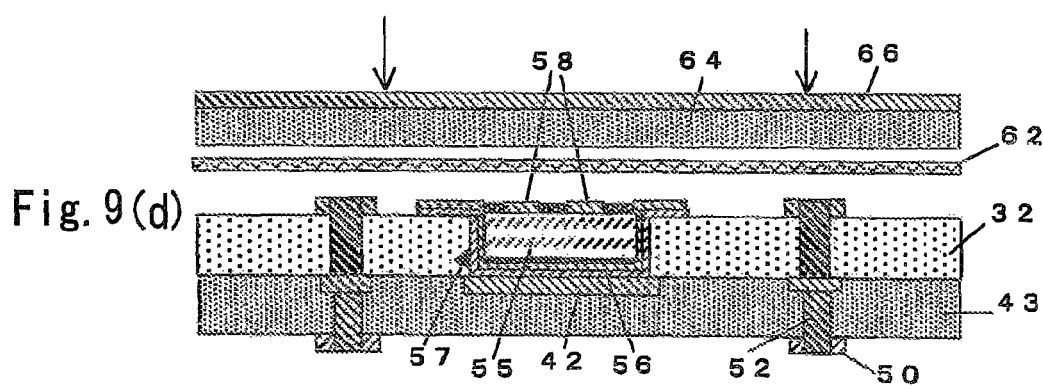
Figure 9E:
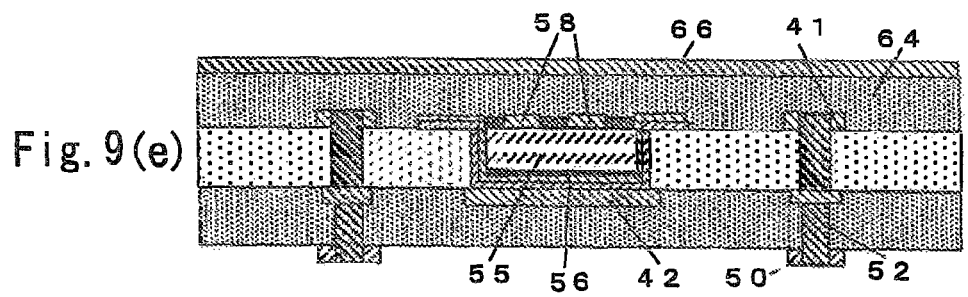
Figure 10A:
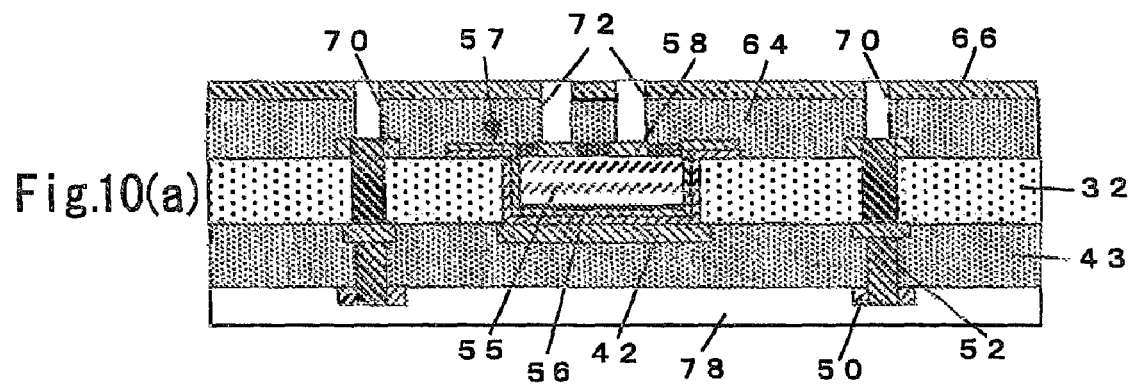
FIG. 10(a) to (d) are schematic sectional drawings showing a part of the process for manufacturing a multilayer printed circuit board according to Embodiment 3-1 of the present invention.
Figure 10B:
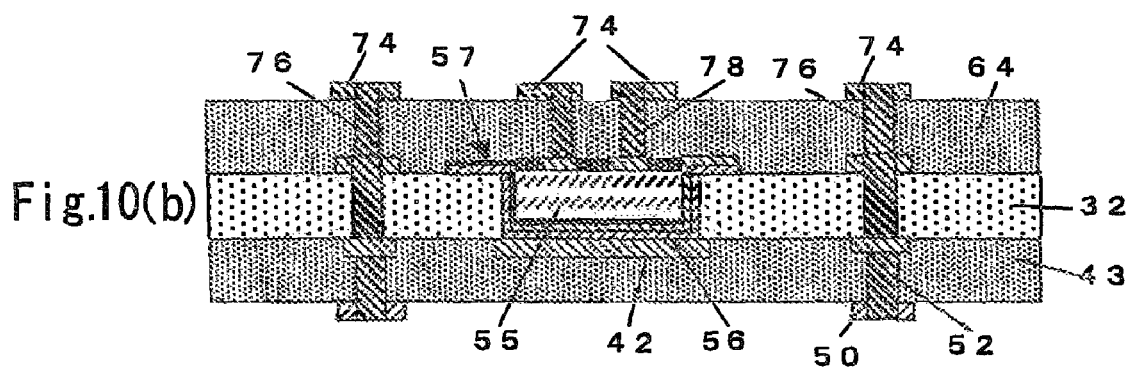
Figure 10C:
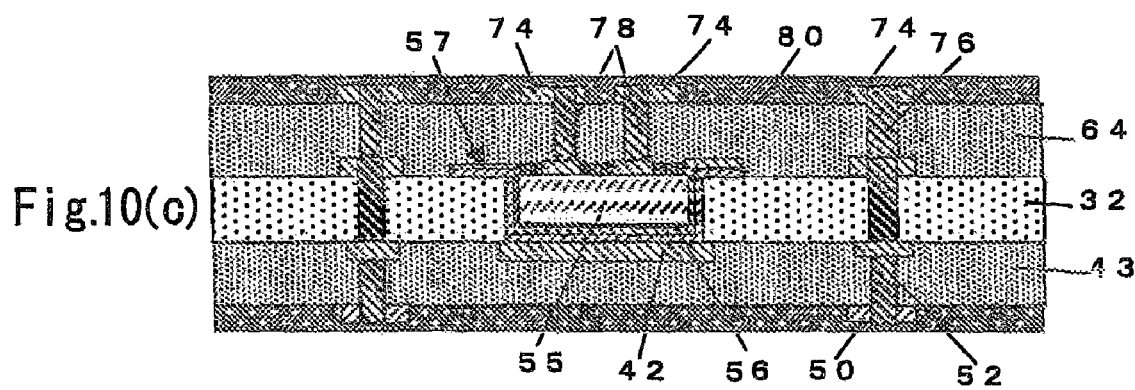
Figure 10D:
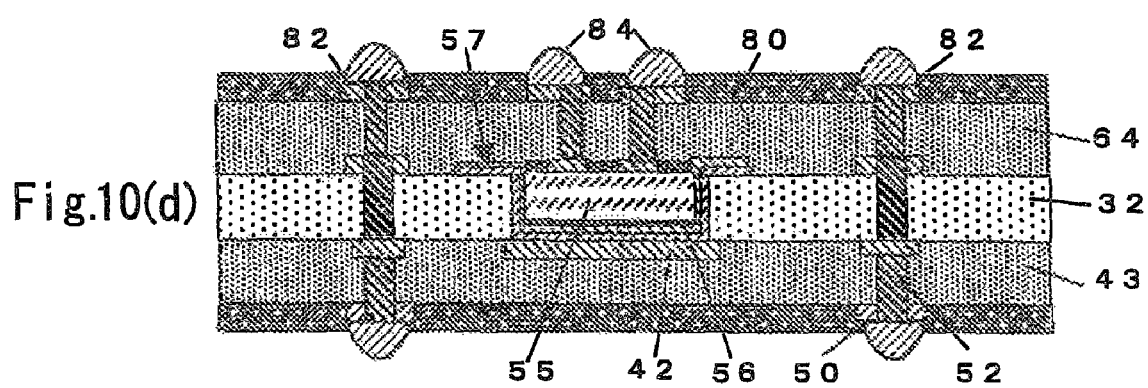

(6) After that, by separating and removing the plating resist 49 using alkali, on the inner wall surface of the concave portion (bottom and side) and the margin of the opening of the concave portion, a metal layer 57 for shielding formed by the electroless copper plating film 57a and electrolytic copper plating 57b is formed (Refer FIG. 9(b)).

Additionally, the surface of the metal layer 42 with a flat surface that is exposed on the bottom of the concave portion is coated with the electroless copper plating film 57a, and the metal layer 57 for shielding is formed according to which electrolytic copper plating 57b is formed on the electroless copper plating film 57a.

(7) Furthermore, a multilayer printed circuit board is manufactured by processing in the same way as (10) to (17) in Embodiment 1-1 (Refer to FIG. 9(c) to FIG. 10(d)).

Embodiment 3-2

A multilayer printed circuit board is manufactured by processing in the same way as Embodiment 3-1 with the exception of embedding semiconductor elements 55 with a mediation layer in the concave portion 42 of the substrate for housing semiconductor elements.

Embodiment 3-3

A multilayer printed circuit board is manufactured by processing in the same way as Embodiment 3-1 with the exception of forming a metal layer for shielding using nickel and embedding semiconductor elements 55 in the concave portion 42 of the substrate for housing semiconductor elements.

Embodiment 3-4

A multilayer printed circuit board is manufactured by processing in the same way as Embodiment 3-1 with the exception of forming a metal layer for shielding using silver and embedding semiconductor elements 55 in the concave portion 42 of the substrate for housing semiconductor elements.

Embodiment 4-1

In the process of (9) above, under the following laser radiation conditions, a multilayer printed circuit board is manufactured by processing in the same way as Embodiment 3-1 with the exception of forming a taper with an angle of 85 degrees on the side of the concave portion for housing semiconductor elements.

Embodiment 4-2

In the process of (9) above, under the following laser radiation conditions, a multilayer printed circuit board is manufactured by processing in the same way as Embodiment 3-1 with the exception of forming a taper with an angle of 85 degrees on the side of the concave portion 42 for housing semiconductor elements and further embedding the semiconductor element 55 with a mediation layer in the concave portion 42.

What is claimed is:
1. A multilayer printed circuit board comprising:
a first resin-insulating layer having a concave portion;
a semiconductor element positioned in the concave portion, the semiconductor element having a surface on which an electrode and an insulating film are formed;
a second resin-insulating layer formed over the semiconductor element;
a conductor circuit formed on the second resin-insulating layer; and
an electromagnetic shield formed around the concave portion and configured to electromagnetically shield the semiconductor element,
wherein the second resin-insulating layer has a via hole that electrically connects the semiconductor element and the conductor circuit,
said electromagnetic shield includes a bottom layer on which the semiconductor element is placed,
the bottom layer comprises at least one of a first bottom metal layer and a second bottom metal layer,
the first bottom metal layer is formed inside said concave portion, and
the second bottom metal layer is formed outside the concave portion.

2. The multilayer printed circuit board according to claim 1, wherein the second bottom metal layer is formed on a bottom of said concave portion.

3. The multilayer printed circuit board according to claim 1, wherein said electromagnetic shielding comprises a side metal structure comprising one of a metal coating an inner wall surface of a plurality of non-through holes, a metal filling a plurality of non-through holes, and a plurality of columns comprising a metal.

4. The multilayer printed circuit board according to claim 1, wherein said electromagnetic shield comprises a side metal structure.

5. The multilayer printed circuit board according to claim 1, wherein said electromagnetic shield comprises a metal layer formed on an inner wall of said concave portion.

6. The multilayer printed circuit board according to claim 1, wherein said concave portion is tapered to be broader from a bottom upward.

7. A multilayer printed circuit board comprising:
a first resin-insulating layer having a concave portion;
a semiconductor element positioned in the concave portion;
a second resin-insulating layer formed on the semiconductor element, the second resin-insulating layer comprising a fiber base material;
a conductor circuit formed on the second resin-insulating layer; and
an electromagnetic shield formed around the concave portion and configured to electromagnetically shield the semiconductor element,
wherein the second resin-insulating layer has a via hole that electrically connects the semiconductor element and the conductor circuit,
said electromagnetic shield includes a bottom layer on which the semiconductor element is placed,
the bottom layer comprises at least one of a first bottom metal layer and a second bottom metal layer,
the first bottom metal layer is formed inside said concave portion, and
the second bottom metal layer is formed outside said concave portion.

8. The multilayer printed circuit board according to claim 7, wherein the second bottom metal layer is formed on a bottom of said concave portion.

9. The multilayer printed circuit board according to claim 7, wherein said electromagnetic shield comprises a side metal structure.

10. The multilayer printed circuit board according to claim 7, wherein said electromagnetic shield is a side metal layer formed so as to be at least one form selected from among a form in which the inner wall surface of a plurality of non-through holes is coated with metal, a form in which metal fills a plurality of non-through holes, and a form consisting of a plurality of columns.

11. The multilayer printed circuit board according to claim 10, wherein at least one part of said side metal layer is coupled with another.

12. The multilayer printed circuit board according to claim 10, wherein said column is at least one form selected from the group consisting of a cylinder, an elliptic cylinder, and a polygonal column.

* * * * *